US012798854B2

United States Patent

(12) United States Patent
Kato et al.

(10) Patent No.: US 12,798,854 B2
(45) Date of Patent: Nov. 17, 2026

(54) OPENING DETECTION SHEET, PACKAGING MATERIAL

(71) Applicants: UACJ CORPORATION, Tokyo (JP); UACJ FOIL CORPORATION, Tokyo (JP)

(72) Inventors: Hisaya Kato, Tokyo (JP); Yohei Haga, Tokyo (JP); Atsushi Koishikawa, Tokyo (JP); Tomohiro Maeda, Tokyo (JP); Tomoki Takeda, Tokyo (JP)

(73) Assignees: UACJ CORPORATION, Tokyo (JP); UACJ FOIL CORPORATION, Tokyo (JP)

( * ) Notice: Subject to any disclaimer, the term of this patent is extended or adjusted under 35 U.S.C. 154(b) by 148 days.

(21) Appl. No.: 18/848,408

(22) PCT Filed: Mar. 30, 2023

(86) PCT No.: PCT/JP2023/013157
§ 371 (c)(1),
(2) Date: Apr. 9, 2025

(87) PCT Pub. No.: WO2023/190857
PCT Pub. Date: Oct. 5, 2023

(65) Prior Publication Data

US 2026/0035155 A1 Feb. 5, 2026

(30) Foreign Application Priority Data

Mar. 31, 2022 (JP) ................................ 2022-059903
Mar. 31, 2022 (JP) ................................ 2022-059904

(51) Int. Cl.
*B32B 3/02* (2006.01)
*B32B 3/26* (2006.01)
(Continued)

(52) U.S. Cl.
CPC ............ *B65D 75/585* (2013.01); *B32B 3/266* (2013.01); *B32B 7/06* (2013.01); *B32B 7/12* (2013.01);
(Continued)

(58) Field of Classification Search
CPC .... B32B 3/02; B32B 3/10; B32B 3/14; B32B 3/18; B32B 3/20; H05K 1/0275; H05K 1/0293; A61J 1/035
See application file for complete search history.

(56) References Cited

U.S. PATENT DOCUMENTS 10,786,428 B1 9/2020 Neuman
2005/0241983 A1* 11/2005 Snyder .................... G16Z 99/00 206/539
(Continued)

FOREIGN PATENT DOCUMENTS

JP 2013-166590 A 8/2013
JP 2020-189636 A 11/2020
(Continued)

OTHER PUBLICATIONS

International Search Report of the International Searching Authority (ISR) corresponding to counterpart International Patent Application PCT/JP2023/013157 mailed May 30, 2023, English translation.
(Continued)

*Primary Examiner* — Elizabeth E Mulvaney
(74) *Attorney, Agent, or Firm* — RENNER, OTTO, BOISSELLE & SKLAR, LLP

(57) ABSTRACT

An opening detection sheet to be attached to a packaging material including storing portions includes a base layer, a circuit pattern disposed on the base layer and including wiring routes. Each of the wiring routes is provided for each of the storing portions. A first terminal is at one end of each of the wiring routes and to be connected to an external device and the first terminal is at a same position on some of the wiring routes.

17 Claims, 28 Drawing Sheets

(51) Int. Cl.

| | |
|---|---|
| ***B32B 7/06*** | (2019.01) |
| ***B32B 7/12*** | (2006.01) |
| ***B65D 75/26*** | (2006.01) |
| ***B65D 75/36*** | (2006.01) |
| ***B65D 75/58*** | (2006.01) |
| ***H05K 1/11*** | (2006.01) |

(52) U.S. Cl.
CPC ........... *B65D 75/26* (2013.01); *B65D 75/367* (2013.01); *H05K 1/11* (2013.01); *B32B 2457/00* (2013.01); *B65D 2401/00* (2020.05)

(56) References Cited

U.S. PATENT DOCUMENTS

| | | | | |
|---|---|---|---|---|
| 2016/0137380 | A1 | 5/2016 | Kosaka | |
| 2018/0125761 | A1* | 5/2018 | Conlon | B65B 65/08 |
| 2018/0249573 | A1 | 8/2018 | Becker | |
| 2022/0242640 | A1* | 8/2022 | Kato | H05K 3/44 |

FOREIGN PATENT DOCUMENTS

| | | | |
|---|---|---|---|
| WO | 2015/008528 | A1 | 1/2015 |
| WO | WO 2019/084698 | * | 5/2019 |
| WO | 2020/235513 | A1 | 11/2020 |

OTHER PUBLICATIONS

Japanese Office Action corresponding to counterpart Japanese patent application No. 2022-059903 mailed Oct. 21, 2025, with English translation.

Japanese Office Action corresponding to counterpart Japanese patent application No. 2022-059904 mailed Oct. 21, 2025, with English translation.

Chinese Office Action corresponding to counterpart Chinese patent application No. 202380025831.1 dated May 11, 2026, with English translation.

* cited by examiner

OPENING DETECTION SHEET, PACKAGING MATERIAL

This application is a national phase of International Application No. PCT/JP2023/013157 filed Mar. 30, 2023, which claims priority to Japanese Application No. 2022-059903 filed Mar. 31, 2022, and Japanese Application No. 2022-059904 filed Mar. 31, 2022, each of which is incorporated herein by reference in its entirety.

TECHNICAL FIELD

The present technology relates to an opening detection sheet and a packaging material.

BACKGROUND ART

With respect to a packaging material (such as press through package (PTP)) including storing portions that store objects such as medical tablets, the technology of detecting opening of the storing portion has been known. Such a technology is disclosed in Patent Document 1. The packaging material described in Patent Document 1 includes the storing portions and an opening detection sheet on which a circuit pattern is formed. When an object is taken out of the storing portion, the circuit pattern of the opening detection sheet is broken. With an external opening detection device detecting the breakage of the circuit pattern, the opening of the storing portion is detected.

PRIOR ART DOCUMENT

Patent Document

Patent Document 1: Japanese Unexamined Patent Application Publication No. 2020-189636

Problem to be Solved by the Invention

The circuit pattern of the opening detection sheet is formed to have a different wiring route for each of the storing portions so as to detect opening of each of the storing portions. Therefore, as the number of the storing portions increases, the number of wiring routes of the circuit pattern increases. For example, the PTP for tables generally includes ten or more storing portions and the circuit pattern also needs to have ten or more wiring routes. However, according to the increase in the number of wiring routes, when opening the storing portion, other wiring route that is not for opening detection of the target storing portion may be likely to be broken erroneously. On the other hand, with the interval between the wiring routes being increased to suppress erroneous breakage of the wiring route, the planar size of the opening detection sheet is necessarily increased.

SUMMARY OF THE INVENTION

The present technology was made in view of the above circumstances. An object is to provide an opening detection sheet that suppresses erroneous breakage and a packaging material including the same.

Means for Solving the Problem

Means for solving the problem is described below.

<1> An opening detection sheet to be attached to a packaging material including storing portions includes a base layer, and a circuit pattern disposed on the base layer and including wiring routes. Each of the wiring routes is provided for each of the storing portions. A first terminal is at one end of each of the wiring routes and to be connected to an external device and the first terminal is at a same position on some of the wiring routes.

<2> In the opening detection sheet according to <1>, the wiring routes include a common wiring route that extends in a predetermined direction from the first terminal and is a common route for some of the wiring routes.

<3> In the opening detection sheet according to <2>, the first terminal is disposed at a same position with respect to all of the wiring routes, and the common wiring route is a common route for all of the wiring routes.

<4> The opening detection sheet according to any one of <1> to <3> further includes second terminals each of which is at other end of each of the wiring routes and to be connected to an external device, and the second terminals are disposed for the wiring routes, respectively.

<5> In the opening detection sheet according to <4>, the second terminals are disposed at different positions for the wiring routes, respectively.

<6> In the opening detection sheet according to <4> or <5>, the base layer has a rectangular plan view shape, and the first terminal and the second terminals are disposed on one edge portion of the plan view shape.

<7> In the opening detection sheet according to any one of <4> to <6>, the base layer has an elongated rectangular shape, and the first terminal and the second terminals are disposed on one short-side edge portion of the rectangular shape.

<8> In the opening detection sheet according to <7>, as a distance from the one short-side edge portion to the storing portions increases, the wiring routes corresponding to the storing portions become longer.

<9> In the opening detection sheet according to <7> or <8>, the wiring routes have a U-shape extending from the first terminal to the second terminals, respectively.

<10> A packaging material includes a cover with which the storing portions are sealed, and the opening detection sheet according to any one of <1> to <9> that is attached to the cover. An object stored in one of the storing portions can be taken out by pushing and breaking the cover and the opening detection sheet.

<11> In the packaging material according to <10>, the wiring routes overlap centers of the storing portions, respectively, in a plan view.

<12> The opening detection sheet according to <1>, further includes perforation lines for assisting breaking of the wiring routes. The wiring routes include overlapping wiring routes each of which overlaps at least one of the storing portions in a plan view, each of the perforation lines is provided for each of the storing portions, and each of the perforation lines has an end portion that is curved toward a center side of a corresponding one of the storing portions.

<13> In the opening detection sheet according to <12>, the perforation lines are disposed to sandwich each of the overlapping wiring routes.

<14> In the opening detection sheet according to <12> or <13>, the perforation lines are disposed to surround a center of each of the storing portions.

<15> In the opening detection sheet according to any one of <12> to <14>, the perforation lines are formed in perforations.

<16> In the opening detection sheet according to any one of <12> to <15>, at least a portion of each of the perforation lines extends through the base layer.

<17> The opening detection sheet according to any one of <12> to <16> further includes an adhesive layer disposed on the base layer on an opposite side from the circuit pattern, and a release paper that is to be removed from the adhesive layer before the opening detection sheet being bonded to the packaging material to expose the adhesive layer.

<18> A packaging material includes a cover with which the storing portions are sealed, and the opening detection sheet according to any one of <12> to <17> attached to the cover. Objects stored in the storing portions can be taken out by pushing and breaking the cover and the opening detection sheet.

<19> In the packaging material according to <18>, each of the storing portions stores an object, and at least a portion of the perforation lines overlaps in a plan view a position where the object is to be contacted when the object is pushed out.

Effects of the Invention

According to the present technology, an opening detection sheet that suppresses erroneous breakage and a packaging material including the same can be achieved.

MODES FOR CARRYING OUT THE INVENTION

First Embodiment

An opening management system 10 according a first embodiment will be described with reference to FIGS. 1 to 24B. An X-axis, a Y-axis and a Z-axis may be present in some of the drawings and each of the axial directions represents a direction represented in each drawing. Direction along the X-axis, the Y-axis, and the Z-axis correspond to the right-left direction, the front-rear direction, and the upper-bottom direction, respectively. However, the directions are defined temporally and may not be limited thereto.

Figure 1:
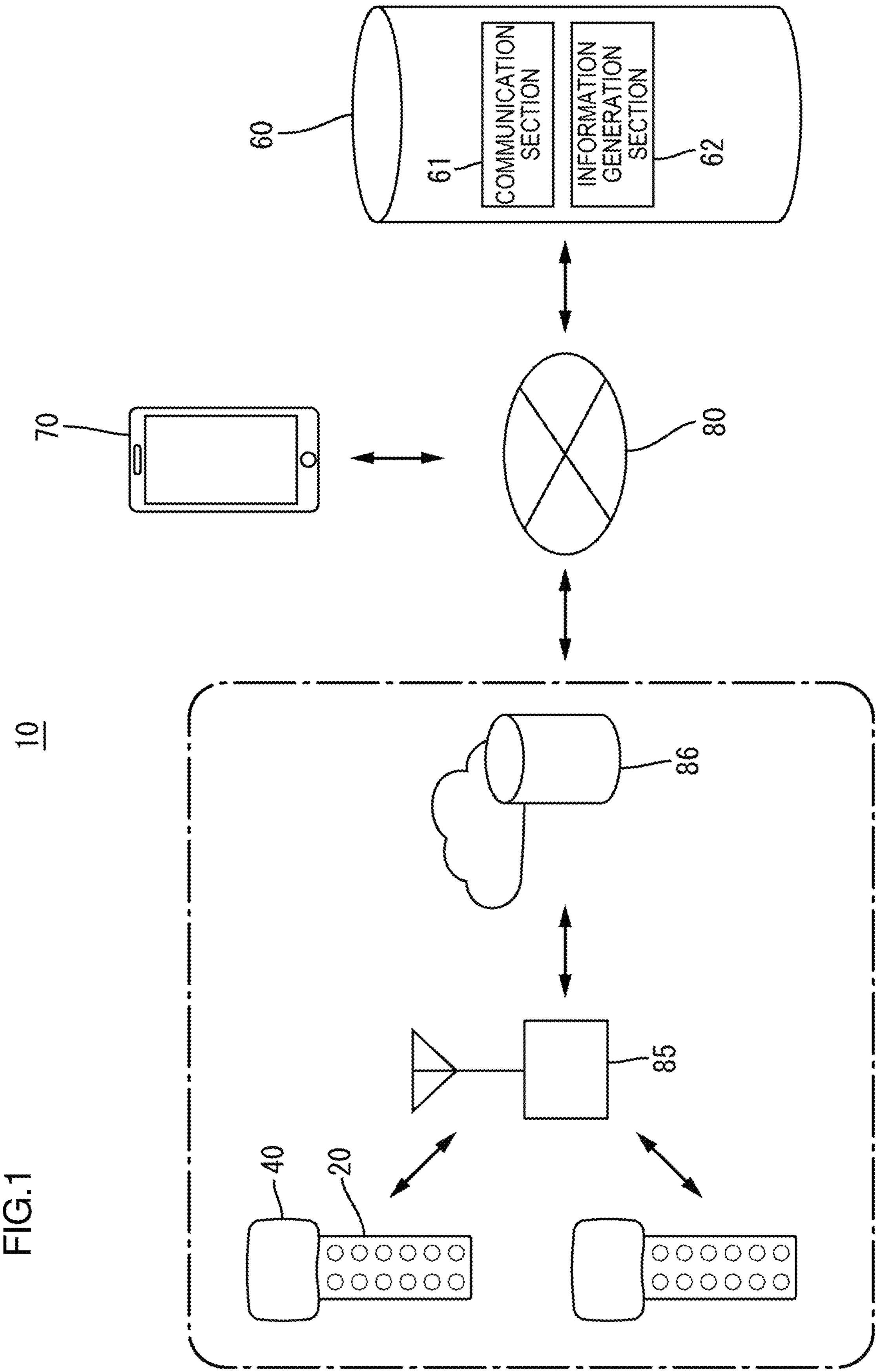
FIG. 1 a general view of an opening management system according to a first embodiment FIG. 2 a perspective view of an opening detection device that is attached to a packaging material FIG. 3 a perspective view of the opening detection device FIG. 4 a perspective view of a built-in components of the opening detection device FIG. 5 a perspective view of the opening detection device where a second casing is moved upward FIG. 6 a magnified perspective view of a right portion of a first casing FIG. 7 a cross-sectional view taken along I-I line in FIG. 3

The opening management system 10 is a system for managing medication regarding medicine T based on an opening status of a packaging material 20 that stores the medicine T such as medical tablets (one example of a stored object). According to this embodiment, an opening management system for medicine will be described as an example of the opening management system 10; however, the stored object may not be the medicine T and the opening management system 10 may be widely used for the opening management of the packaging material. As illustrated in FIG. 1, the opening management system 10 includes an opening detection device 40 that is attached to a packaging material 20, a management server (an application server) 60, and an information processing terminal 70. The management server 60 and the information processing terminal 70 are connected to a communication network 80.

As illustrated in FIG. 1, the opening detection device 40 is attached to each packaging material 20. The opening detection device 40 is connected to the communication network 80 via a low power wide area wireless communication (LPWA). The LPWA communication is wireless communication that can achieve long distance communication with small power consumption (for example, transmission distance is 10 km or more with transmission power of 1 W or less). The LPWA communication is known as a basic technology of IoT (internet of things) technology. The LPWA communication service is provided by multiple telecommunication companies and examples of such communication companies include Sigfox (registered trademark), LoRa (registered trademark), and NB-IoT. The opening detection devices 40 are wirelessly connected to a LPWA base station 85 and the base station 85 is connected to a LPWA communication server (LPWA crowd server) 86. The communication server 86 is connected to the communication network 80. Therefore, the opening detection devices 40 can communicate with the management server 60, which is connected to the communication network 80, via the communication server 86. Each of the opening detection devices

40 has its own ID information and the management server 60 can communicate with each of the opening detection devices 40.

The opening detection device 40 needs to be connected to at least one of the management server 60 and the information processing terminal 70. Communication technology other than LPWA may be used as the communication method of the opening detection device 40. For example, the wireless communication technology with low power consumption such as Bluetooth low energy (BLE, registered trademark) is preferable and Wi-Fi or LTE, which are more generally used, may be used as the wireless communication.

As illustrated in FIG. 1, the information processing terminal 70 is a generally-used information processing device such as a smartphone and a computer. It is supposed that the information processing terminal 70 is used by a patient and medical staff of the hospital or the pharmacy who prescribes the medicine T. However, the user of the information processing terminal 70 is not particularly limited (a user of the information processing terminal 70 will be simply referred to as a user). The information processing terminal 70 may include multiple information processing terminals 70 that are used by different users. A user inputs registration information such as a time of taking the medicine T via the information processing terminal 70 and the information processing terminal 70 executes a program for displaying the opening status of the medicine T. In this embodiment, the program is installed in the information processing terminal 70 as an application software (hereinafter, referred to as an application); however, the program may not be installed in the terminal 70 and may be executed via a browser software. The information processing terminal 70 is an embodiment of input means and display means of the opening management system 10. Accordingly, the opening detection device 40 may not necessarily include such functions. This miniaturizes the opening detection device 40 and consumption power of the opening detection device 40 can be reduced.

The management server 60 provides information and processed results in response to the request from the information processing terminal 70 or the opening detection device 40. The management server 60 is configured to perform as a server that executes the program for performing the above functions. In this embodiment, the management server 60 is an example of a server computer illustrated in FIG. 1; however, the management server 60 may be an imaginary one in a computer network in space with distributed computing. The management server 60 may execute processing with artificial intelligence.

As illustrated in FIG. 1, the management server 60 at least includes a communication section 61 that is connected to the communication network 80 and an information generation section 62. The management server 60 can communicate with the information processing terminal 70 via the communication section 61 and communicate with the opening detection devices 40 via the communication server 86. The information generation section 62 generates setting information based on the registration information from the information processing terminal 70. The predefined process regarding the opening detection is performed by the opening detection device 40 according to the setting information. The process performed by the management server 60 will be described later in detail.

Figure 2:
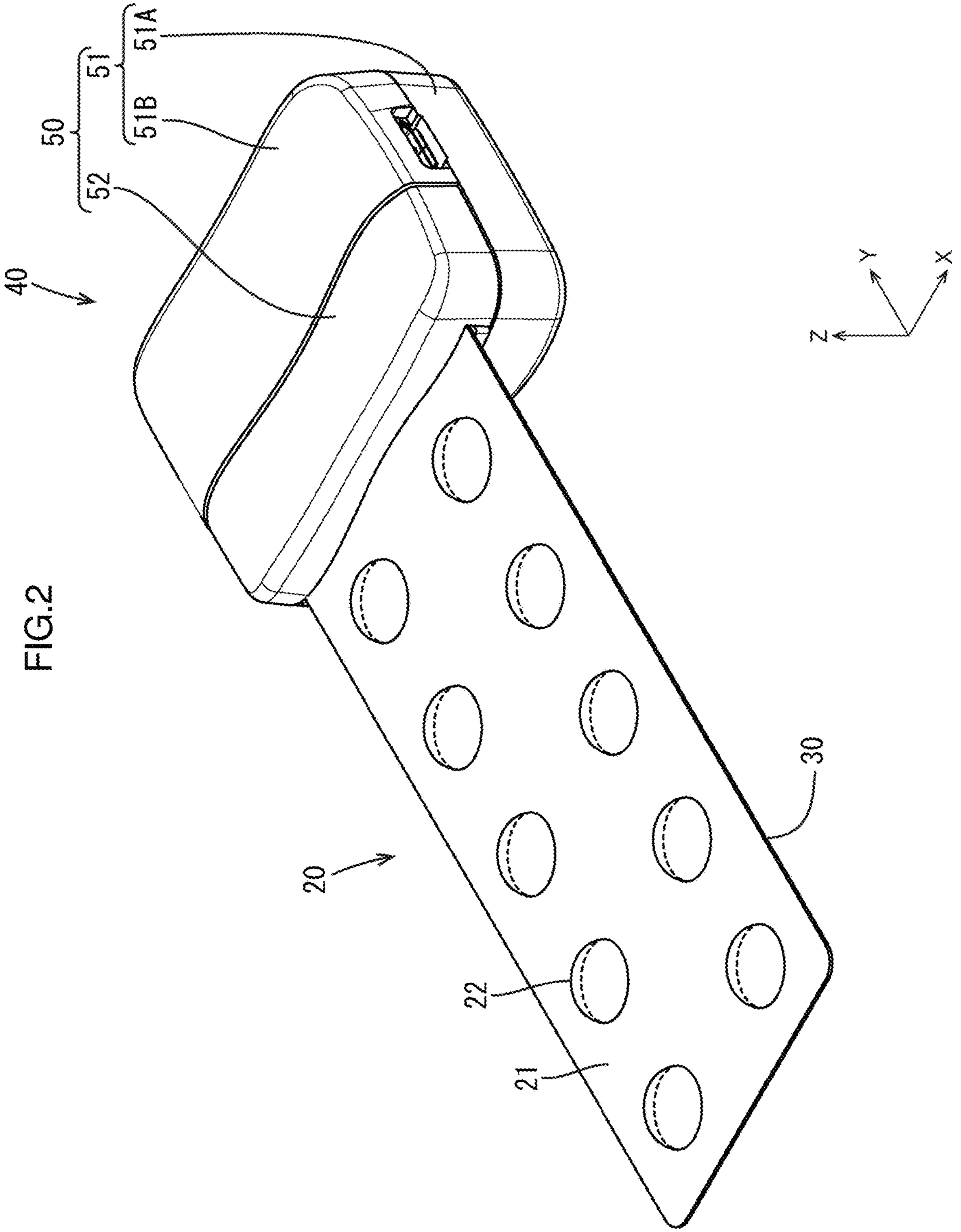
Figure 3:
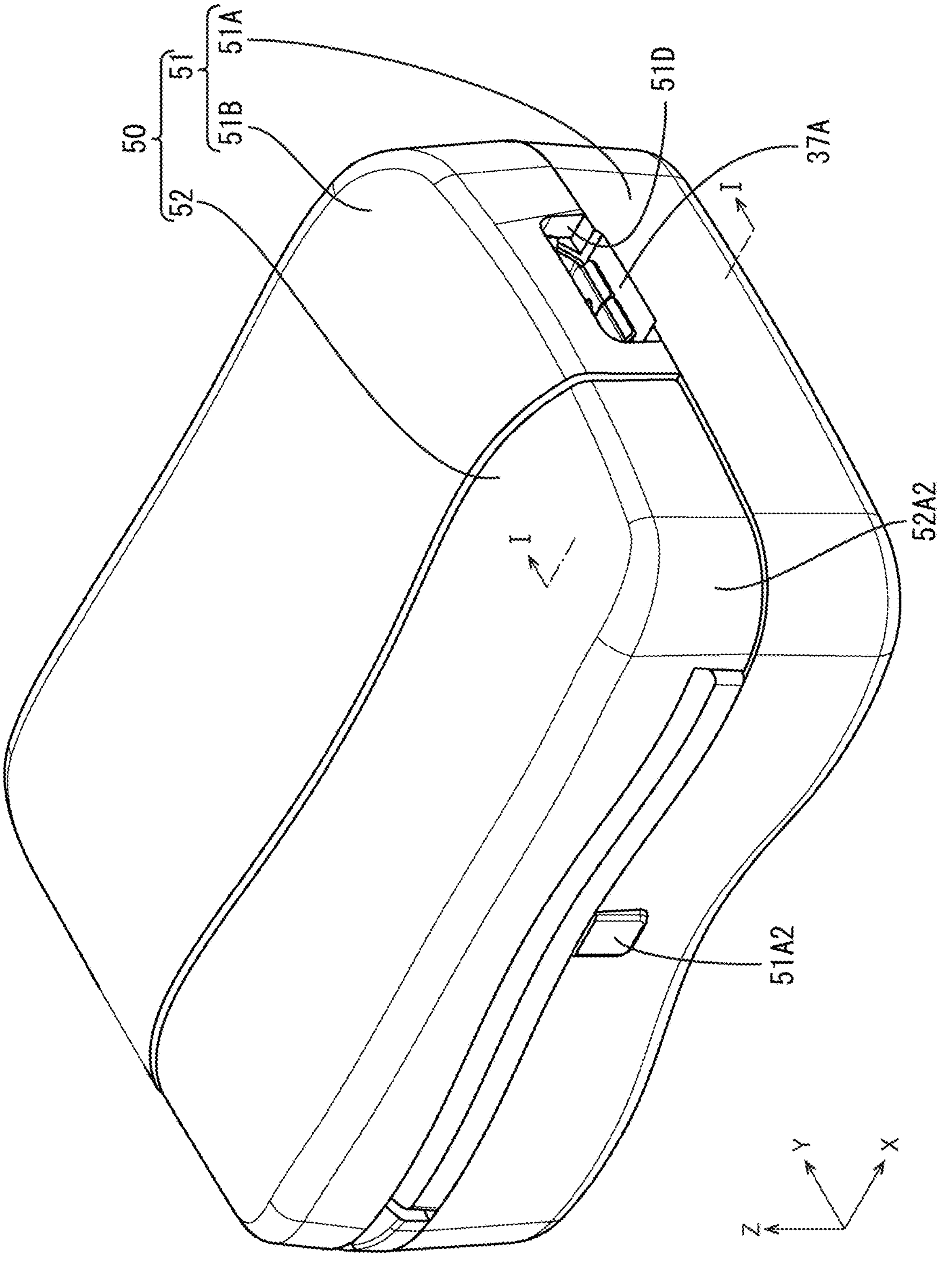
Figure 4:
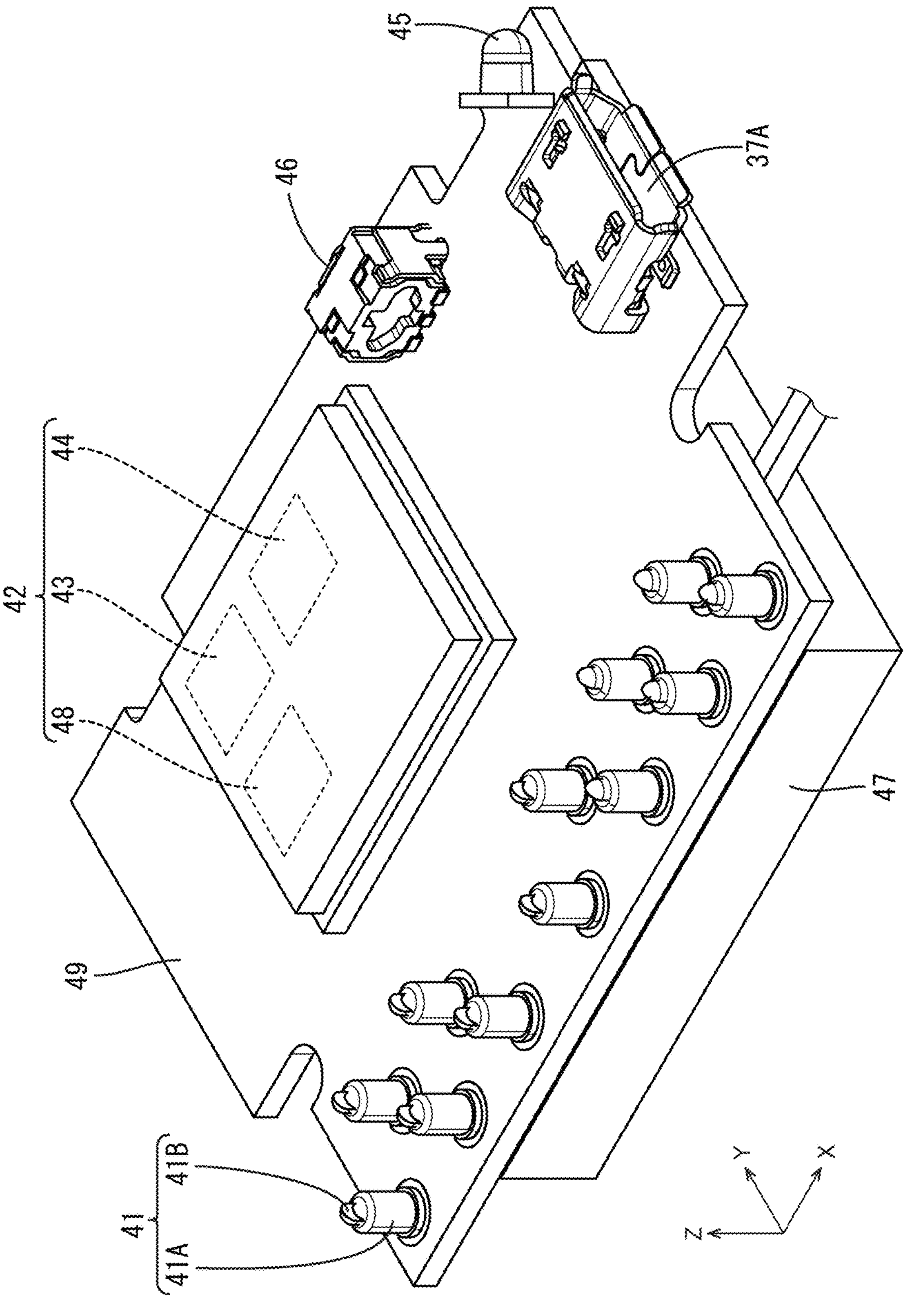

As illustrated in FIGS. 2 to 4, the opening detection device 40 includes connection portions 41 (twelve connection portions 41 in this embodiment), a communication module 42 for the LPWA, a LED 45 (an example of an informing section), a reset button 46 (one example of an operation section), a rechargeable battery 47 (one example of a power supply section), a base board 49, and a casing 50. The connection portions 41, the communication module 42, the LED 45, the reset button 46, and a connector insertion portion 37A via which an external power supply is connected to the rechargeable battery 47 are mounted on the base board 49. The base board 49 on which the components are mounted and the rechargeable battery 47 are arranged in the casing 50. The casing 50 includes a holding portion that sandwiches and releasably holds the packaging material 20.

As illustrated in FIG. 4, the connection portion 41 includes a support body 41A and a contact 41B. The support body 41A is mounted on the base board 49 and has a substantially circular columnar shape in this embodiment; however, the shape of the support body 41A is not limited thereto. The contact 41B protrudes upward from an upper surface of the support body 41A (a surface on an opposite side from the base board 49). At least a protruding end of the contact 41B has electrically conductive properties. With the packaging material 20 being set in the opening detection device 40 (FIG. 2), the contacts 41B are contacted with and electrically connected to a circuit pattern 32 of the packaging material 20, which will be described later.

As illustrated in FIG. 4, the communication module 42 includes a communication section 43 (specifically, an antenna), a control section 44 (specifically, a microcomputer), and a storing section 48 (specifically, a ROM and a RAM). The communication section 43 is wirelessly connected to the base station 85 and can communicate with the management server 60 via the communication server 86. The storing section 48 stores control programs and ID information of the opening detection devices 40.

The control section 44 controls each section of the opening detection device 40 based on the control program stored in the storing section 48 and the setting information transmitted from the management server 60. The control section 44 includes a timer having a time counting function. The control section 44 also functions as a detection section detecting opening of the packaging material 20. The control section (the detection section) 44 supplies a current to the connection portions 41 and detects a voltage caused in the circuit pattern 32 of the packaging material 20. The control section 44 compares the detected voltage and a predefined threshold value. If determining that the detected voltage is equal to or smaller than the threshold value, it is determined that the circuit pattern 32 is not broken and the packaging material 20 is in an unopened state. If determining that the detected voltage is greater than the threshold value, it is determined the packaging material 20 is in an opened state where the circuit pattern 32 is broken. The control section 44 can determine the opening status based on the resistance value of the circuit pattern 32 that changes according to the breakage of the circuit pattern 32. The control section 44 may determine the opening status based on a current value with a predefined voltage being applied.

If the detection result (determination result) by the control section 44 is the unopened state, the LED 45 is turned on with steady light (blinking light) with a predefined pattern and it is informed that medicine is not taken yet. The LED 45 is turned on when the opening detection device 40 is connected to an external power supply. The LED 45 is arranged in the casing 50 and the light emitted by the LED 45 passes through the casing 50. More in detail, the casing 50 is formed with a material and a thickness such that the casing 50 can transmit the light emitted by the LED 45. The LED 45 is one example of the informing section. The informing section may be light emitting means other than the LED, sound generating means such as a buzzer, display means displaying a message, or any combination thereof.

Figure 5:
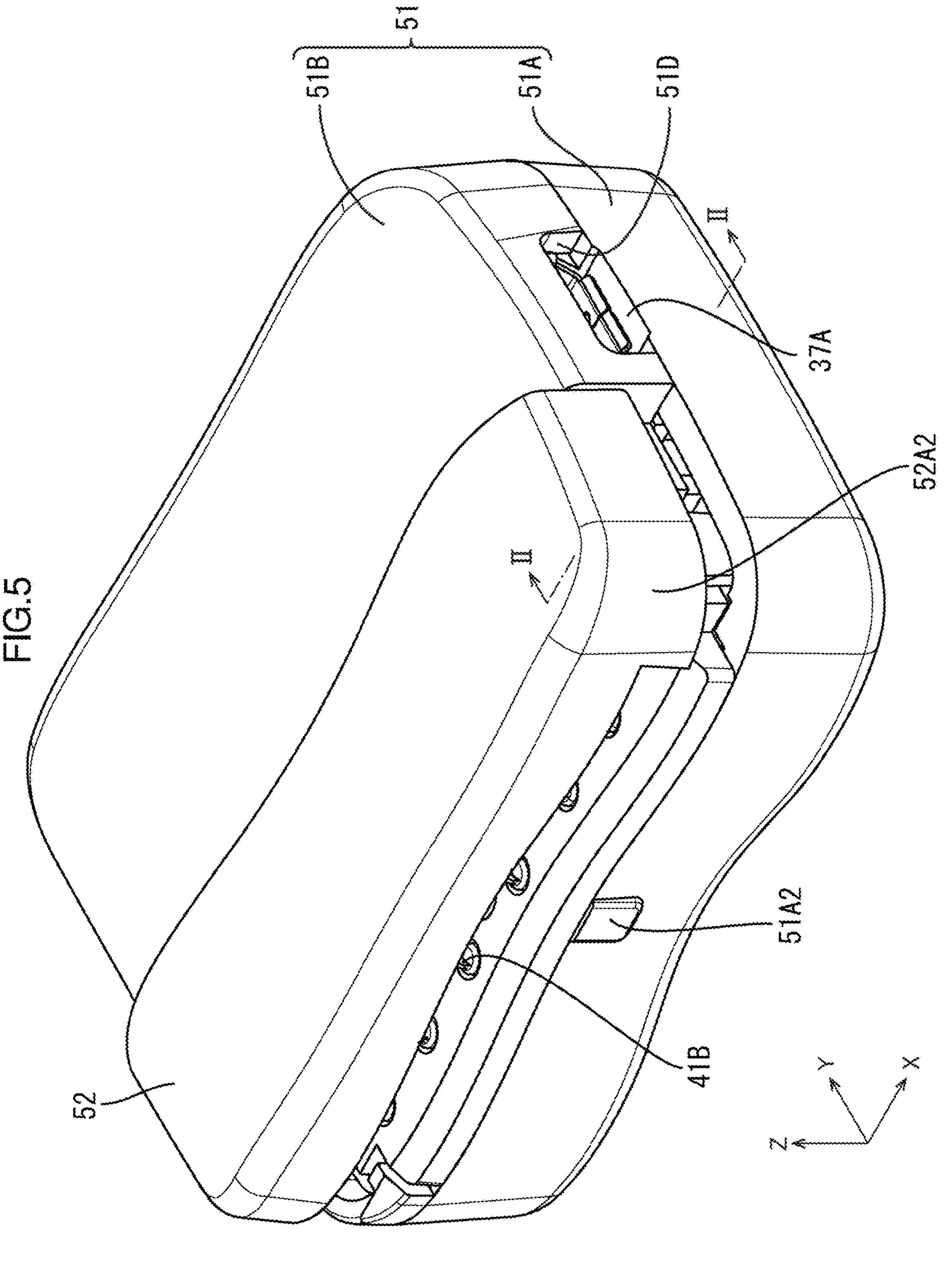

The casing 50 is made of resin and has a laterally elongated cubic shape having round edges as illustrated in FIGS. 3 and 5. The casing 50 includes a first casing 51 and a second casing 52. The first casing 51 corresponds to a most section of the casing 50 and is recessed in a front upper section. The second casing 52 is a cover that covers the recessed front upper section of the first casing 51. The second casing 52 is attached to the first casing 51 so as to be movable in the upper-bottom direction (the Z-axis direction). By moving the second casing 52, as illustrated in FIG. 2, the packaging material 20 is disposed between and held by the first casing 51 and the second casing 52. Namely, the casing 50 includes a holding structure including the first casing 51 and the second casing 52 as the holding portion that holds the packaging material 20. In the following, each component of the casing 50 will be described in detail. The packaging material 20 is not illustrated in the drawings other than FIG. 2 to clearly illustrate the configuration of the casing 50.

Figure 6:
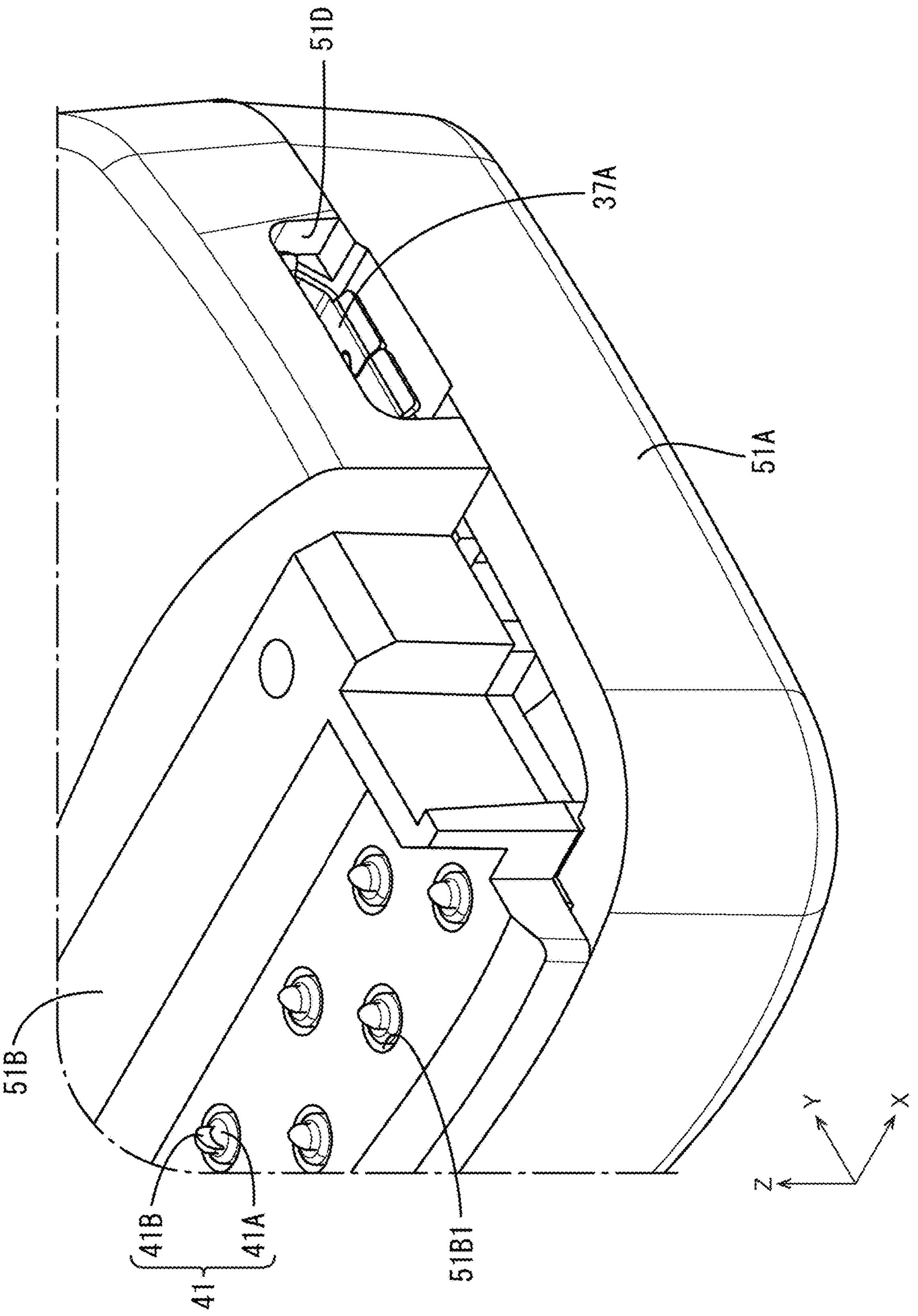
Figure 11:
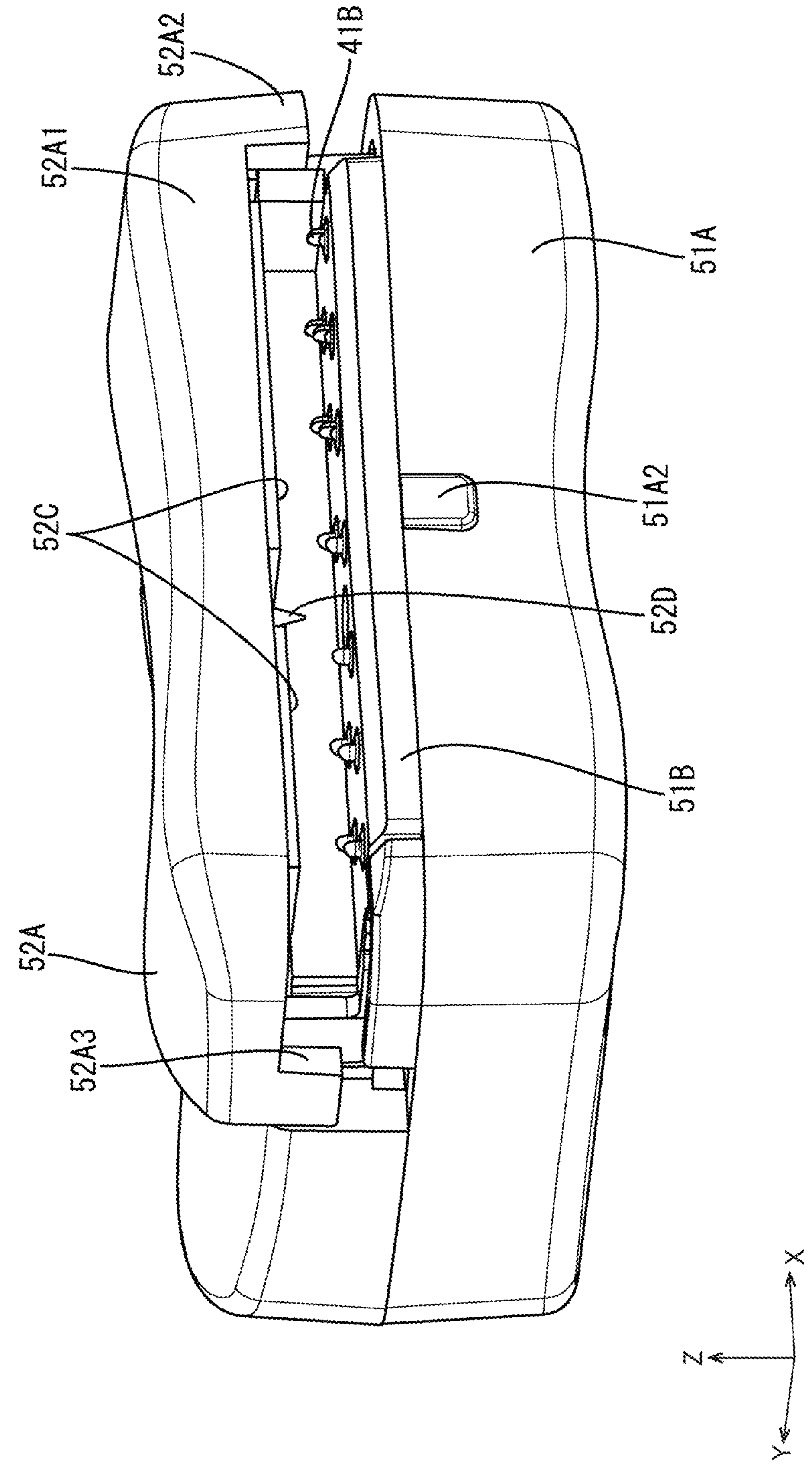
FIG. 11 a perspective view of the opening detection device where the second casing is moved upward FIG. 12 a magnified perspective view of a portion near first projecting portions and a second projecting portion in FIG. 11

As illustrated in FIGS. 5 to 8, the first casing 51 includes a bottom portion 51A and an upper portion 51B. The bottom portion 51A has a tray shape that opens upward. The upper portion 51B covers the opening of the bottom portion 51A from an upper side. The rechargeable battery 47 is arranged in the bottom portion 51A and the base board 49 is disposed above the rechargeable battery 47. The base board 49 is covered by the upper portion 51B from above. The upper portion 51B includes through holes 51B1 through which the connection portions 41 on the base board 49 pass, respectively. The contacts 41B of the connection portions 41 protrude from the respective through holes 51B1 and are exposed outside (FIG. 6 and FIG. 11).

Figure 7:
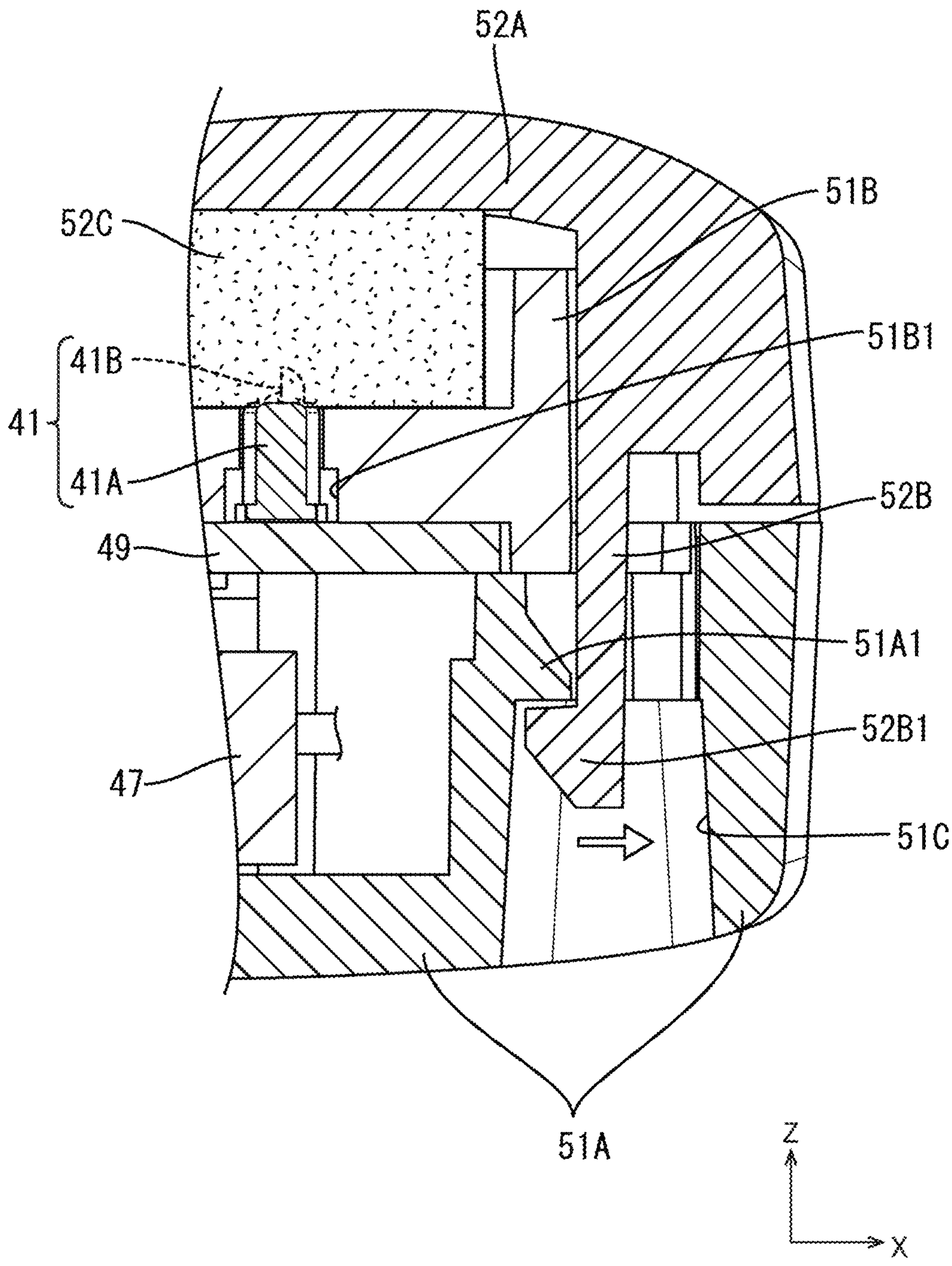
Figure 8:
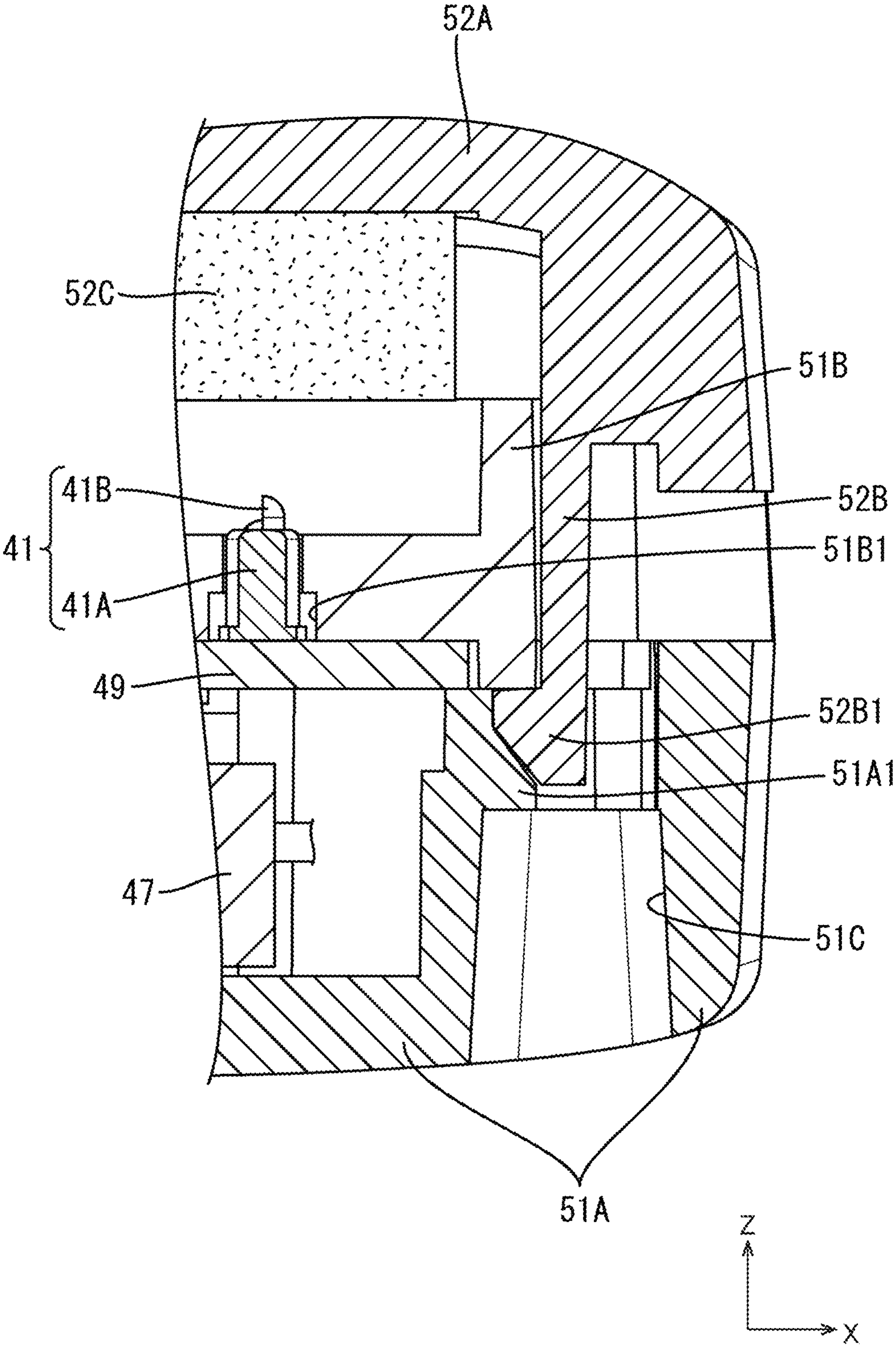
FIG. 8 a cross-sectional view taken along II-II line in FIG. 5
Figure 9:
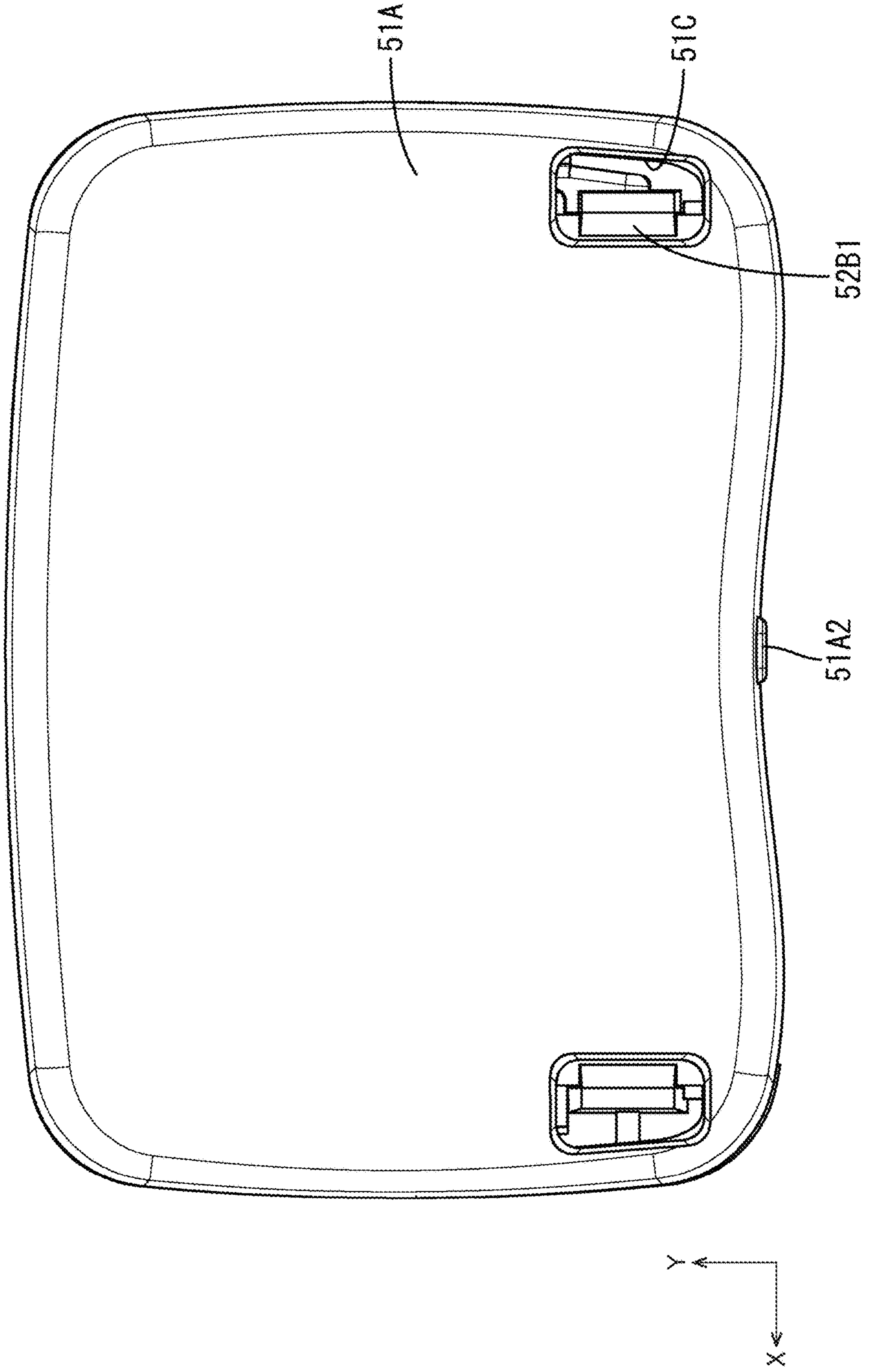
FIG. 9 a bottom view of the opening detection device

As illustrated in FIGS. 7 to 9, the bottom portion 51A of the first casing 51 includes two first communication holes 51C that receive two fitting portions 52B of the second casing 52, respectively. The first communication holes 51C are formed to overlap the respective fitting portions 52B in a plan view. In the bottom portion 51A of the first casing 51, a portion of an opening edge of the first communication hole 51C protrudes upward and the bottom portion 51A includes a protrusion 51A1 at the protruding end. The protrusion 51A1 is fitted to a protrusion 52B1 of the fitting portion 52B of the second casing 52 (FIG. 7, FIG. 8).

As illustrated in FIG. 5, a positioning mark 51A2 (one example of a positioning portion) is on a front surface of the bottom portion 51A. In this embodiment, the positioning mark 51A2 is a protrusion and formed at a middle of the front surface of the bottom portion 51A with respect to the right-left direction (the X-axis direction). The positioning mark 51A2 is a reference indicator for positioning the packaging material 20 at a predefined position (for example, an end 32A of the circuit pattern 32 of the packaging material 20). With such a configuration, the positioning of the packaging material 20 on the opening detection device 40 is easy and the circuit pattern 32 of the packaging material 20 is surely contacted with the contacts 41B of the opening detection device 40 and the circuit pattern 32 and the opening detection device 40 can be electrically conductive.

Figure 10:
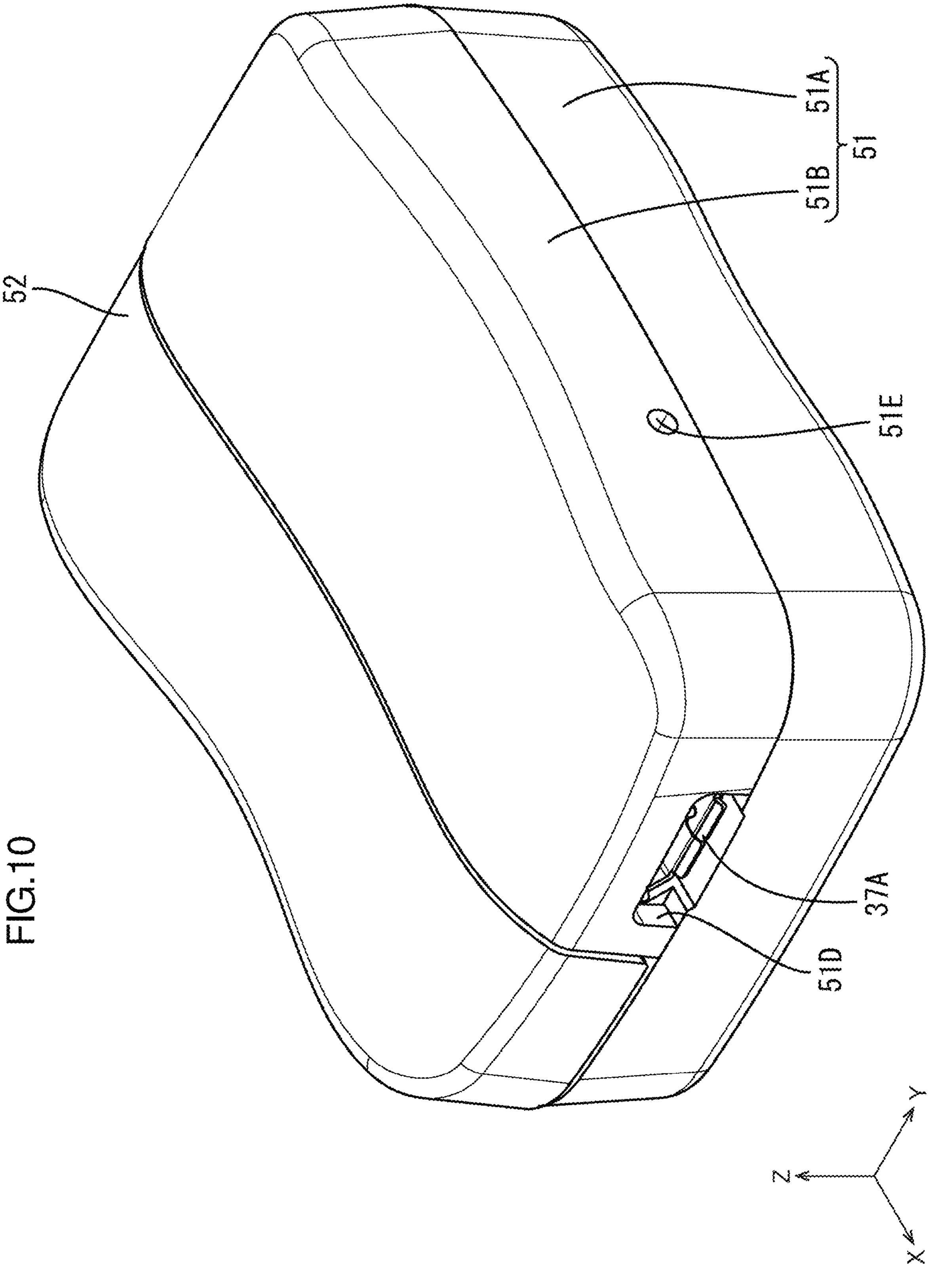
FIG. 10 a perspective view of the opening detection device

As illustrated in FIG. 5, the first casing 51 includes an insertion hole 51D on a right side portion thereof and a connector is inserted in the connector insertion portion 37A through the insertion hole 51D. As illustrated in FIG. 10, the first casing 51 includes a second communication hole 51E in a rear surface thereof. The second communication hole 51E is communicated with a space in which the reset button 46 is disposed. An operation pin is inserted in the second communication hole 51E from an outside to press the reset button 46 and accordingly, the control section 44 executes a reset process to return the device 40 to an initial state.

As illustrated in FIGS. 7, 8, 11, and 12, the second casing 52 includes a cover 52A, the two fitting portions 52B, two first projecting portions 52C, and a second projecting portion 52D. The cover 52A extends over the exposed contacts 41B. The cover 52A includes a ceiling wall 52A1 that covers the contacts 41B from above and a right wall 52A2 (another example of the positioning portion) that covers the contacts 41B from a right side. The cover 52A does not cover the contacts 41B from a front side and a left side and has an opening 52A3 that has a substantially L-shape and opens frontward and leftward. With the cover 52A including the right wall 52A2 and the opening 52A3, the packaging material 20 can be inserted in the opening 52A3 and positioned with respect to the device with being contacted with the right wall 52A2 when mounting the packaging material 20 in the device 40. Since the cover 52A is open leftward through the opening 52A3, the packaging materials 20 having various sizes (different lengths in the short-side direction) can be fitted in the opening 52A3.

As illustrated in FIGS. 7 and 8, the fitting portion 52B extends downward from the cover 52A and fitted to the bottom portion 51A of the first casing 51. The fitting portion 52B includes the protrusion 52B1 at the extending end thereof and the protrusion 52B1 is fitted to the protrusion 51A1 of the bottom portion 51A. The protrusion 52B1 of the fitting portion 52B is disposed below the protrusion 51A1 (FIG. 7, referred to as a first position) when the second casing 52 moves downward. In such a state, the packaging material 20 is held between the first casing 51 and the second casing 52 and the fitting portion 52B is in a holding state. The protrusion 52B1 of the fitting portion 52B is disposed on the protrusion 51A1 (FIG. 8, referred to as a second position) when the second casing 52 moves upward. In such a state, the packaging material 20 is not held between the first casing 51 and the second casing 52 and the fitting portion 52B is in a non-holding state. The fitting portion 52B is fitted in and connected to the bottom portion 51A of the first casing 51 in the first position and the second position.

With the cover 52A being pushed downward from above, the protrusion 52B1 moves downward from above to below the protrusion 51A1 and the fitting portion 52B moves from the second position to the first position. With an operation pin being inserted through the first communication hole 51C from the outside and the protrusion 52B1 being operated with the operation pin, the fitting portion 52B moves from the first position to the second position. More in detail, as illustrated in FIG. 9, the opening detection device 40 is disposed such that the bottom portion 51A faces upward. In this state, the operation pin is inserted in the first communication hole 51C from the outside and the protrusion 52B1 is pushed downward (toward the upper portion 51B) with being moved in the right-left direction (for example, in a direction illustrated with a blank arrow in FIG. 7) with the operation pin. Then, the protrusion 52B1 slides along a sloped surface 51A1S of the protrusion 51A1. Thus, the fitting portion 52B easily moves from the first position to the second position. Accordingly, to change the state of the packaging material 20 from the holding state (the first position) to the non-holding state (the second position), the protrusion 52B1 is necessarily moved with using the operation pin and cannot be operated directly with a hand. Therefore, an erroneous operation is less likely to occur. In the holding state, the packaging material 20 can be held more stably. In the non-holding state (the second position), the sloped surface 51A1S of the protrusion 51A1 is covered by the protrusion 52B1. Therefore, it is difficult to move the protrusion 52B1 with using the operation pin from the outside and completely detach the second casing 52 from the first casing 51. With such a configuration, the second casing 52 is connected to the first casing 51 so as to be movable in the upper-bottom direction (the Z-axis direction) but not to be completely detached from the first casing 51. The phrase that the first communication hole 51C is communicated with the fitting portion 52B means that the first communication hole 51C is communicated with a space where the fitting portion 52B is disposed in the holding state (the first position).

Figure 12:
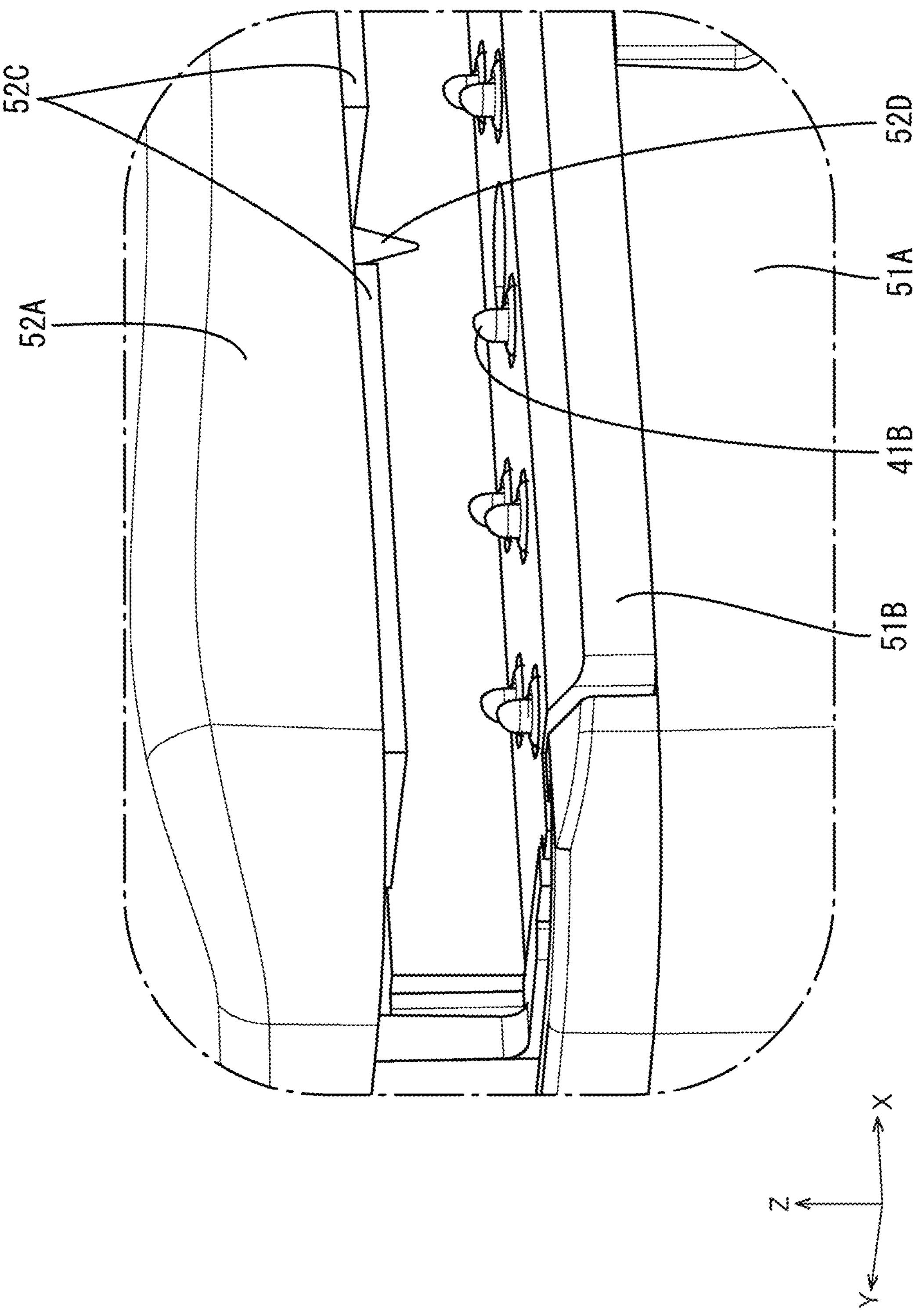

The first projecting portions 52C are made of a soft material having flexibility. As illustrated in FIGS. 11 and 12, the first projecting portions 52C project downward from the cover 52A. The first projecting portion 52C has a laterally elongated cubic shape and two first projecting portions 52C are arranged at an interval with respect to the right-left direction (the X-axis direction). The second projecting portion 52D is made of a hard material and has a tapered bar shape. The second projecting portion 52D is between the two first projecting portions 52C. With the packaging material 20 being mounted in the opening detection device 40 (FIG. 2), projecting surfaces (a lower surface) of the first projecting portions 52C and the distal end of the second projecting portion 52D are press-contacted with the surface of a body member 21 of the packaging material 20.

With the first projecting portions 52C and the second projecting portion 52D being formed, the holding force for holding the packaging material 20 can be increased. The first projecting portions 52C and the second projecting portion 52D are not contacted with the circuit pattern 32 of the packaging material 20 and are not electrically conductive. Therefore, the holding force can be increased without adversely affecting the opening detection. The materials and the shapes of the first projecting portions 52C and the second projecting portion 52D may be altered as appropriate as long as the holding force can be increased by the anti-slip effect. For example, the first projecting portions 52C and the second projecting portion 52D may be made of elastic material, adhesive material, and high friction material. Both of the first projecting portion 52C and the second projecting portion 52D may not be necessarily provided but one of the first projecting portion 52C and the second projecting portion 52D may be provided.

With the casing 50 having the above configuration, the packaging material 20 can be mounted in the opening detection device 40 easily and firmly without using extra fixing member. The mounting and detaching of the packaging material 20 can be performed easily by the movement of the second casing 52.

Figure 13:
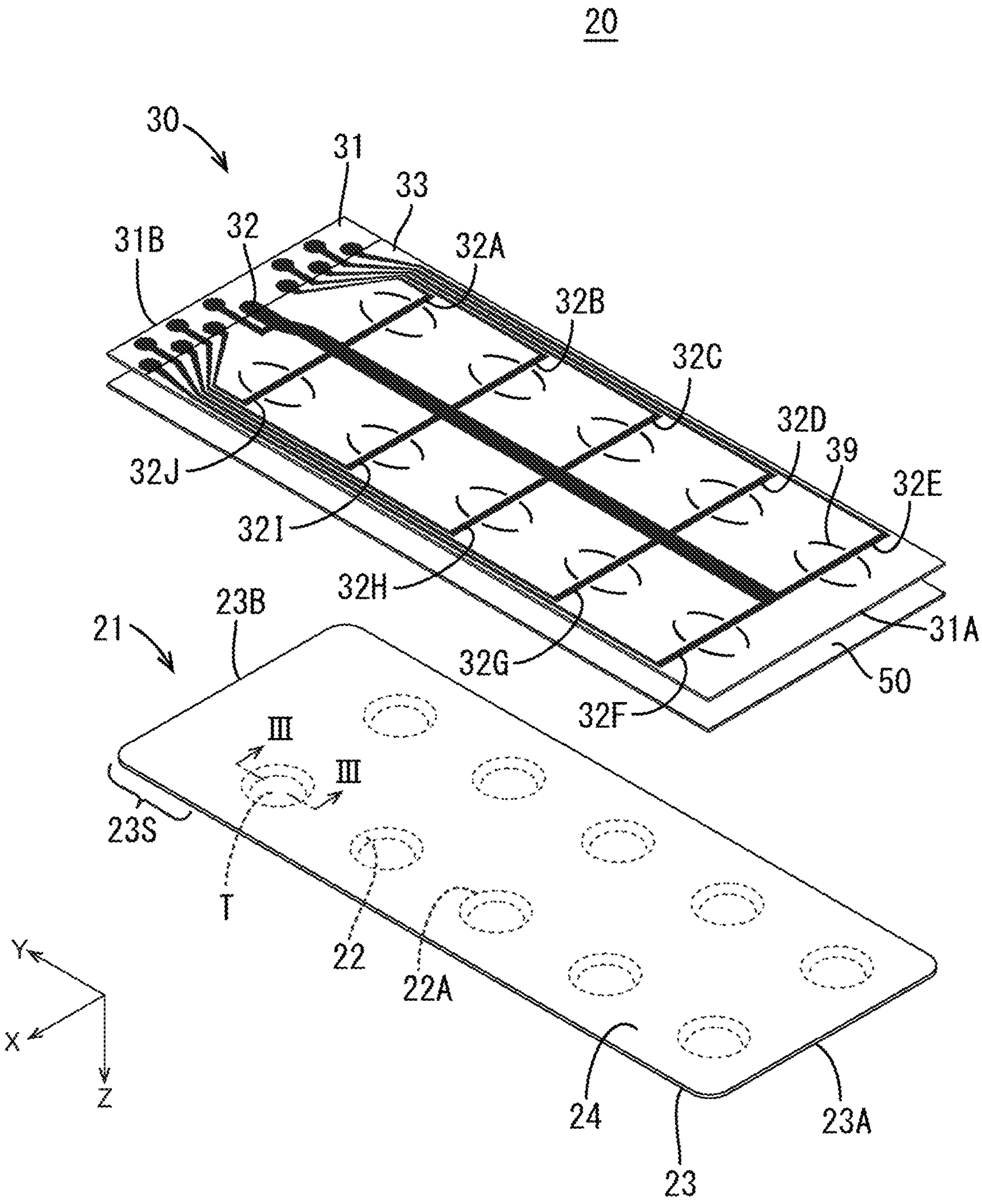
FIG. 13 an exploded perspective view of the packaging material
Figure 14:
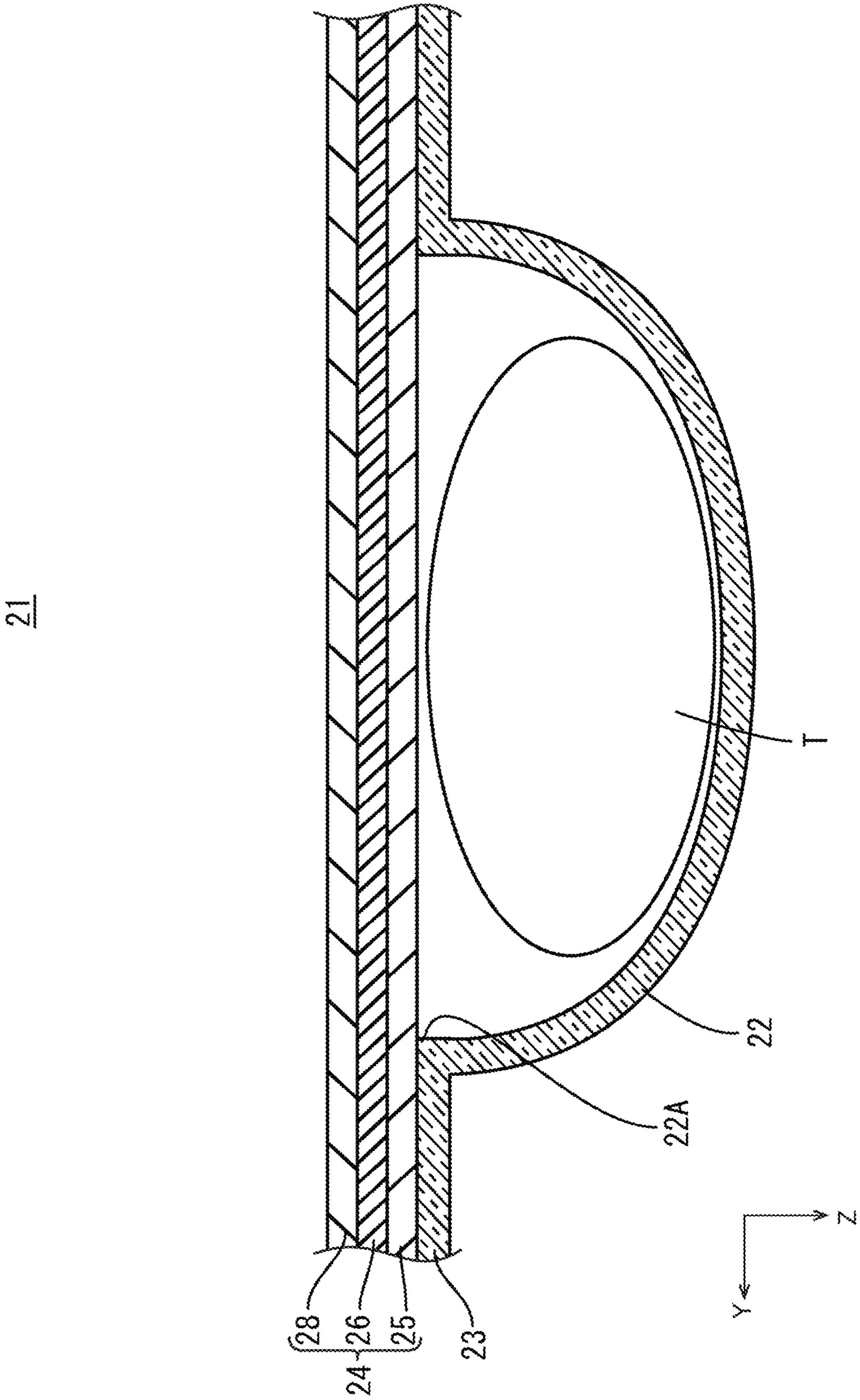
FIG. 14 a cross-sectional view of a body member of the packaging material (a cross-sectional view taken along III-III line in FIG. 13)

Next, the packaging material 20 will be described in detail with reference to FIGS. 13 to 22. As illustrated in FIG. 13, the packaging material 20 includes the body member 21 for storing medicine T such as medical tablets and an opening detection sheet 30 that is attached to the body member 21. The body member 21 is a press through package (PTP) and includes a sheet-shaped container 23 and a cover 24 as illustrated in FIG. 14. The sheet-shaped container 23 includes storing portions 22 in each of which the medicine T is stored. The cover 24 is attached to the sheet-shaped container 23 and covers openings 22A of the storing portions 22 and the storing portions 22 are sealed. The body member 21 has a parallelopiped (rectangular) plan view shape and the opening detection sheet 30 also has a plan view shape similar to that of the body member 21. The opening detection sheet 30 has a plan view size such that the whole body member 21 can be covered. In this embodiment, the opening detection sheet 30 and the body member 21 have a substantially same plan view size.

As illustrated in FIGS. 13 and 14, the sheet-shaped container 23 includes the storing portions 22 that are recessed to be away from the cover 24. The sheet-shaped container 23 is formed by processing resin flat sheet into a predefined shape. Each storing portion 22 has a plan view shape that follows the shape of the medicine T. In this embodiment, the storing portion 22 has a circular plan view shape. Five storing portions 22 are arranged at predefined intervals longitudinal direction (a Y-axis direction) and two storing portions 22 are arranged at predefined intervals in the short side direction (an X-axis direction). A total of ten storing portions 22 are formed. The five storing portions 22 that are arranged in the longitudinal direction are arranged closer to one short side 23A sheet-shaped container 23. Accordingly, the sheet-shaped container 23 includes an extra section 23S between the other short side 23B and the storing portions 22. The extra section 23S is wider than a space between the one short side 23A and the storing portions 22. With respect to a known PTP, the name of the medicine T may be printed on the extra section 23S or the extra section 23S may be used for holding portion.

The cover 24 is a flat sheet member and made of a material that can be pressed to release the object. Portions of the cover 24 other than the portions covering the openings 22A of the storing portions 22 are bonded to the sheet-shaped container 23. As illustrated in FIG. 14, the cover 24 includes a heat seal adhesive layer 25, an aluminum foil 26, and an overcoat layer 28 that are disposed on top of each other from the sheet-shaped container 23 side; however, the layer structure is not limited thereto. The heat seal adhesive layer 25 is made of known heat seal adhesive for the PTP. The aluminum foil 26 is bonded to the sheet-shaped container 23 with the heat seal adhesive layer 25. The overcoat layer 28 is a protection layer made of transparent resin and protects the aluminum foil 26.

As illustrated in FIG. 13, an adhesive layer 38 of the opening detection sheet 30, which will be described later, is exposed by releasing a release paper 50 from the opening detection sheet 30 and the opening detection sheet 30 is attached to a surface of the cover 24. With the opening detection sheet 30 including the release paper 50, the opening detection sheet 30 itself can be kept and distributed separately from the body member 21 before being attached to the body member 21.

Figure 15:
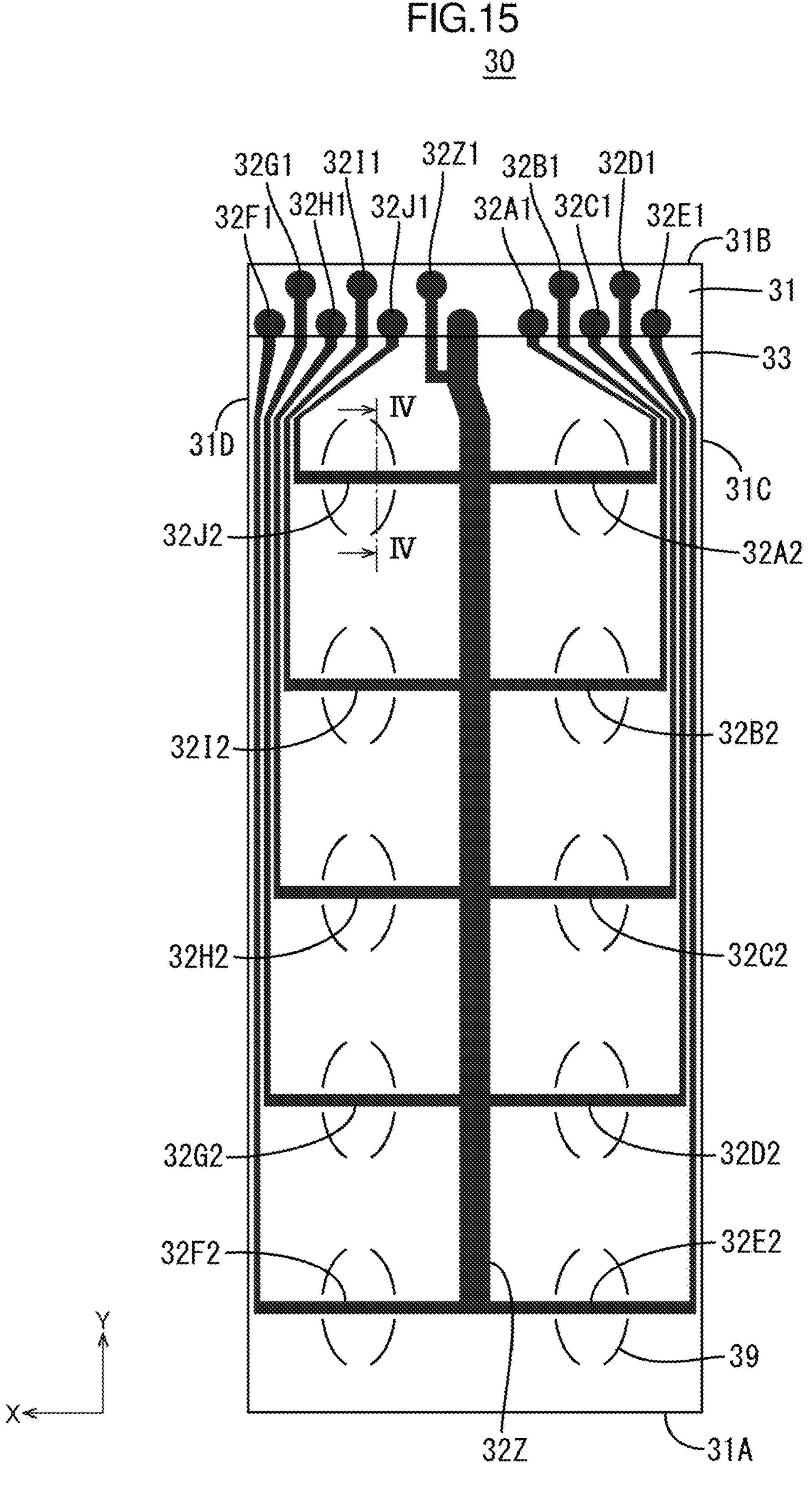
FIG. 15 a plan view of an opening detection sheet
Figure 16:
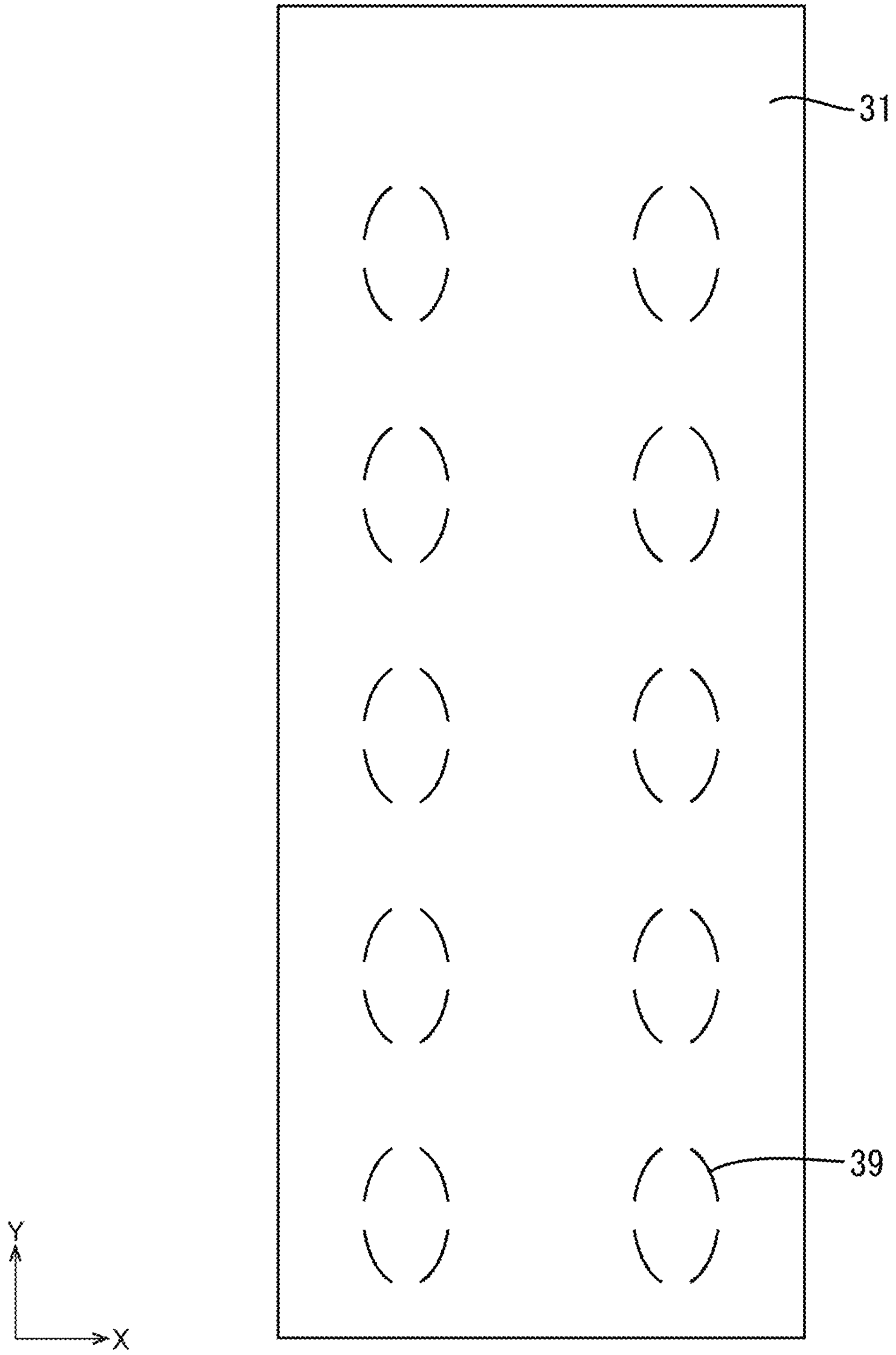
FIG. 16 a plan view of the opening detection sheet
Figure 17:
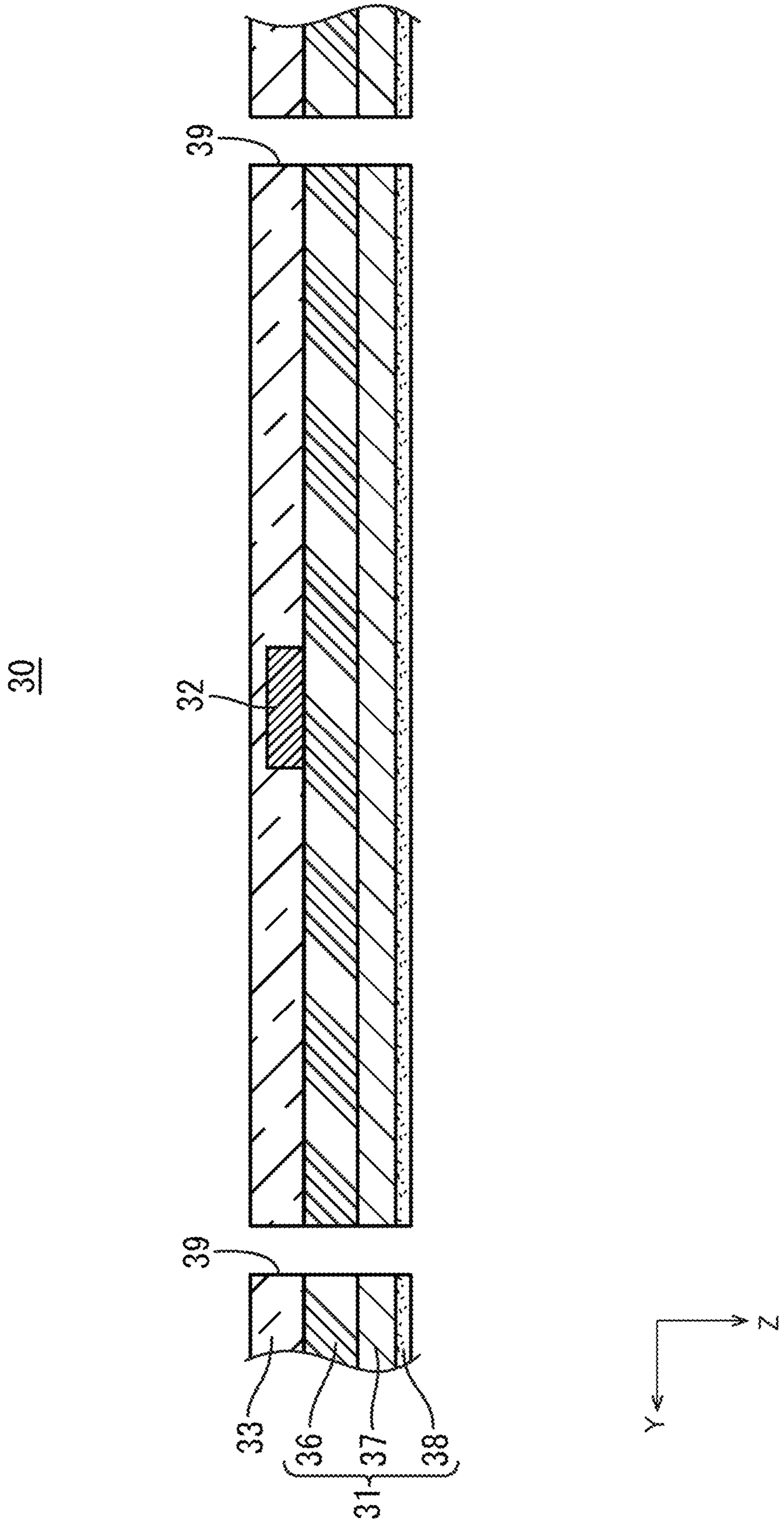
FIG. 17 a cross-sectional view taken along IV-IV line in FIG. 15

As illustrated in FIGS. 15 to 17, the opening detection sheet 30 is a composite member of a sheet form and includes a base layer 31, the circuit pattern 32, and a protection layer 33 that are disposed on top of each other. The base layer 31 is a multilayer member and includes the adhesive layer 38, a metal layer 37, and an insulating layer 36 that are disposed on top of each other in this order from the body member 21 side. The layer structure is not particularly limited as long as the contact surface that is contacted with the circuit pattern 32 has insulation properties. The adhesive layer 38 is an adhesive or an adhesive tape made of acryl-based material, urethane-based material, silicon-based material, or rubber-based material. The adhesive layer 38 adheres to the cover 24 of the body member 21. The metal layer 37 is made of an aluminum foil, for example. The insulating layer 36 is made of resin such as polyethylene terephthalate (PET), polystyrene, polyurethane, polyimide.

As illustrated in FIGS. 15 to 17, the circuit pattern 32 includes wiring patterns that are formed by printing on the base layer 31 with electrically conductive ink. The circuit pattern 32 is formed by supplying electrically conductive ink on the surface of the base layer 31 in a predefined pattern form and curing the ink. The electrically conductive ink is an electrically conductive composition that is obtained by dispersing electrically conductive particles in a vehicle including a binder. Various kinds of particles of material having good electrically conductive properties such as gold, silver, copper, platinum, aluminum, an alloy thereof, and carbon black may be used as the electrically conductive particles. The method of supplying the electrically conductive ink may be a supplying method with a dispenser and various kinds of printing methods such as rotogravure printing, and ink jetting printing. A dry-curing method, and a heat-curing method may be used as the method of curing the electrically conductive composition as appropriate according to the type of the electrically conductive ink to be used.

As illustrated in FIG. 13, the circuit pattern 32 is a wiring pattern that includes the same number of wiring routes as the storing portions 22. In this embodiment, the circuit pattern 32 includes ten wiring routes 32A, 32B, 32C, 32D, 32E, 32F, 32G, 32H, 32I, 32J (referred to as 32A-32J hereinafter). The wiring routes 32A-32J have different routes for the respective storing portions 22.

As illustrated in FIG. 15, two ends of each of the wiring routes 32A-32J are disposed on one (a short-side edge 31B) of two short-side edges 31A, 31B of the base layer 31. The short-side edge 31B corresponds to the extra section 23S of the sheet-shaped container 23 of the body member 21. The two ends of each of the wiring routes 32A-32J are disposed on a section of the base layer 31 that overlaps the extra section 23S in a plan view. The two ends of each of the wiring routes 32A-32J include terminals that are contacted with and connected to the contacts 41B of the opening detection device 40. More in detail, each of the wiring routes 32A-32J includes a first terminal 32Z1 at one end of the two ends and includes a second terminal 32A1, 32B1, 32C1, 32D1, 32E1, 32F1, 32G1, 32H1, 32I1, 32J1 (may be referred to as 32A1-32J1, hereinafter) at the other end of the two ends.

The first terminal 32Z1 is at the same position with respect to all the wiring routes 32A-32J and is a common terminal for all the wiring routes 32A-32J. The first terminal 32Z1 is connected to one of the contacts 41B and supplied with a predefined reference potential (specifically, GND potential) via the contact 41B. The second terminals 32A1-32J1 are disposed at different positions for the respective wiring routes 32A-32J. Each of the second terminals 32A1-32J1 is connected to corresponding one of the contacts 41B and supplied with a predefined potential via the contact 41B. With a predefined potential difference being created between the first terminal 32Z1 and one of the second terminals 32A1-32J1 (a voltage being applied), a current flows through a corresponding wiring route 32A-32J.

As illustrated in FIG. 15, the wiring routes 32A-32J extend to connect the first terminal 3221 and the respective second terminals 32A1-32J1 and are formed in a U-shape. More in detail, the wiring routes 32A-32J extend from the first terminal 32Z1 in a middle portion with respect to the short-side direction of the base layer 31 along the longitudinal direction. Then, the wiring routes 32A-32J are bent and branched in the short-side direction and bent again and extend along the long-side edge 31C or 31D of the base layer 31 to the respective second terminals 32A1-32J1. Thus, the wiring routes 32A-32J are formed in a U-shape. As the distance from the short-side edge 31B of the base layer 31 to the storing portion 22 increases, the corresponding wiring route 32A-32J becomes longer.

The wiring route 32A-32J includes a common wiring route 32Z and an overlapping wiring route 32A2, 32B2, 32C2, 32D2, 32E2, 32F2, 32G2, 32H2, 3212, 32J2 (may be referred to as 32A2-32J2, hereinafter). The common wiring route 32Z is a common route for all the wiring routes 32A-32J. The common wiring route 32Z extends in a middle of the base layer 31 with respect to the short-side direction. The common wiring route 32Z extends from the first terminal 32Z1 along the longitudinal direction of the base layer 31. By providing the common wiring route 32Z, portions of the wiring routes 32A-32J can be commonly provided and the layout of the circuit pattern 32 can be made smaller.

Figure 18:
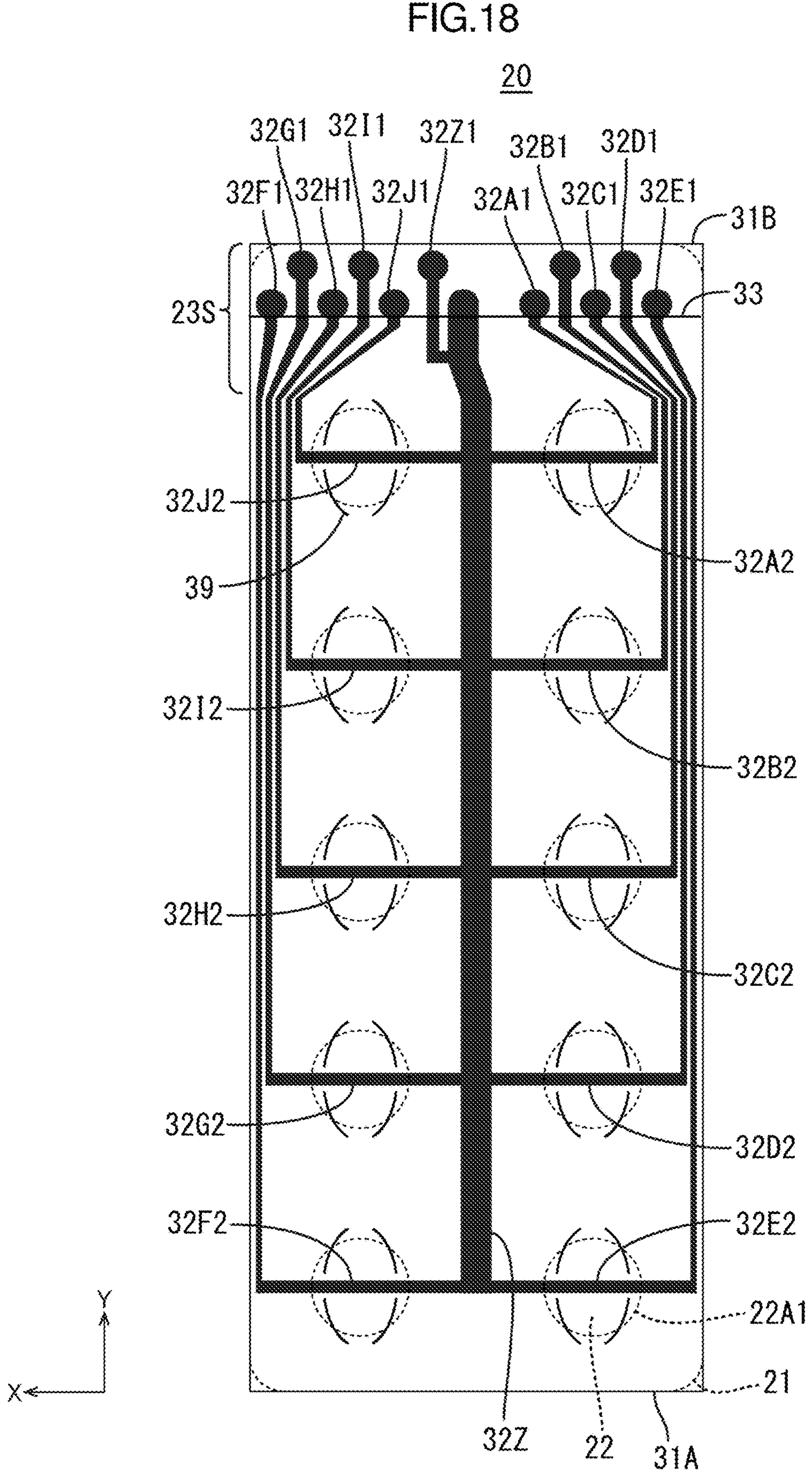
FIG. 18 a plan view of the packaging material.
Figure 21:
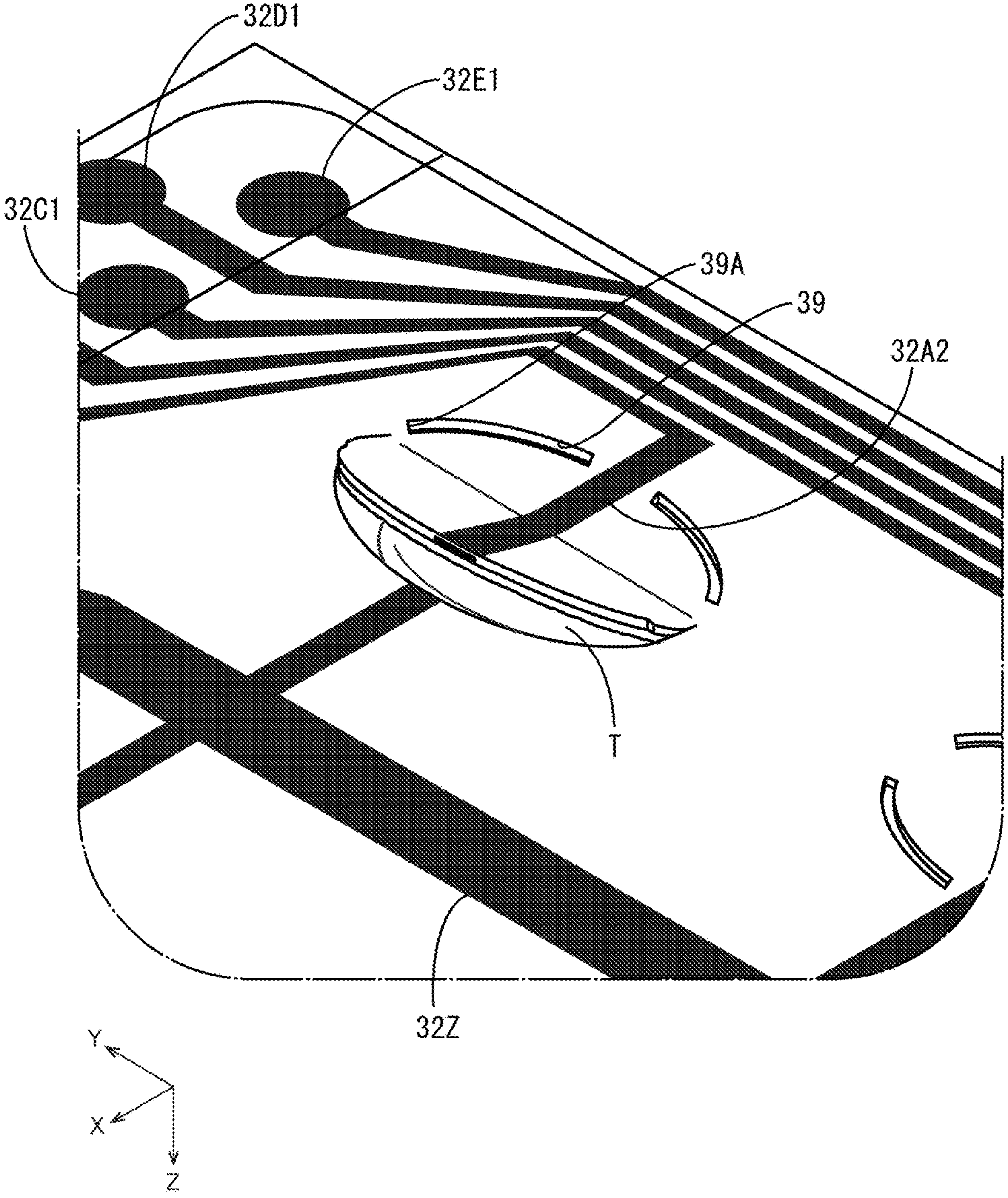
FIG. 21 a magnified perspective view of the packaging material that is opened FIG. 22 a plan view illustrating perforation lines of a comparative example FIG. 23A a flowchart illustrating a process of the opening management system FIG. 23B a flowchart illustrating a process of the opening management system FIG. 24A a flowchart illustrating a process of the opening management system FIG. 24B a flowchart illustrating a process of the opening management system FIG. 25 a general view of an opening management system according to a second embodiment FIG. 26 a plan view of a packaging material according to a third embodiment

The overlapping wiring routes 32A2-32J2 extend along the short-side direction of the base layer 31 and have different routes for the different storing portions 22. As illustrated in FIG. 18, the overlapping wiring routes 32A2-32J2 overlap the openings 22A of the storing portions 22, respectively, in a plan view. With such a configuration, as illustrated in FIG. 21, with the medicine T being pushed out from the storing portion 22, the opening detection sheet 30 is broken together with the cover 24 and the corresponding overlapping wiring route 32A2-32J2 is broken. Each of the overlapping wiring routes 32A2-32J2 preferably extends through a portion overlapping a center 22A1 of the opening 22A of the corresponding storing portion 22 (namely, the center 22A1 of the storing portion 22 in a plan view). Accordingly, the overlapping wiring route 32A2-32J2 is broken more surely when the opening detection sheet 30 is broken.

According to the above-described circuit pattern 32, even with the opening detection sheet 30 including a large number of storing portions 22 such as ten storing portions 22, it is possible to achieve the opening detection sheet 30 in which the corresponding wiring route 32A-32J of the target storing portion 22 can be broken without increasing a planar size of the opening detection sheet 30 and with maintaining the planar size of the opening detection sheet 30 same as the planar size of the body member 21. Furthermore, when opening the storing portion 22, a wiring route other than the wiring route for opening detection of the target storing portion 22 is less likely to be erroneously broken.

The protection layer 33 is made of insulating material and covers and protects the circuit pattern 32 as illustrated in FIG. 17. In this embodiment, the protection layer 33 is formed by printing (with mat on printing, MOP) non-glossy transparent resin material. The material and the forming method may not be particularly limited as long as it has insulation properties. The protection layer 33 is printed with coating on portions of the surface of the base layer 31 other than the first terminal 3221 and the second terminals 32A1-32J1 of the wiring routes 32A-32J. Therefore, the protection layer 33 does not cover the first terminal 3221 and the second terminals 32A1-32J1. When the packaging material 20 is mounted in the opening detection device 40 (FIG. 2), the terminals 32Z1, 32A1-32J1 are contacted with and electrically connected to the contacts 41B of the opening detection device 40.

As illustrated in FIGS. 15 to 19, the opening detection sheet 30 includes perforation lines 39 to assist the breaking of the overlapping wiring routes 32A2-32J2 of the wiring routes 32A-32J. The perforation lines 39 are provided for the respective overlapping wiring routes 32A2-32J2 (and the respective storing portions 22). In this embodiment, four perforation lines 39 are formed for every storing portion 22 to surround the center 22A1 of the storing portion 22; however, the number of perforation lines 39 is not limited to four.

Figure 19:
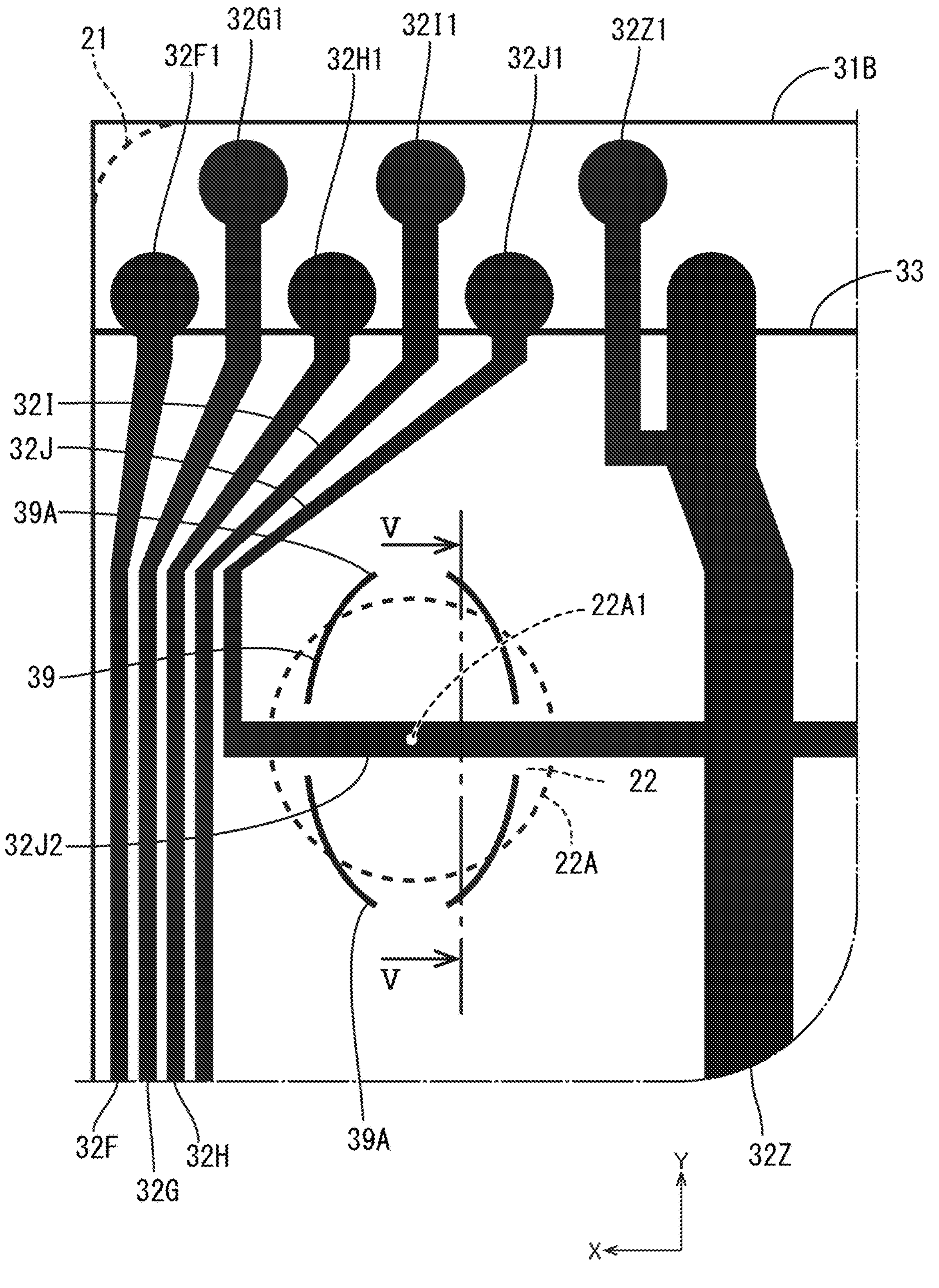
FIG. 19 a magnified plan view of an upper-right portion of FIG. 18

As illustrated in FIG. 19, the perforation lines 39 extend in the longitudinal direction as a whole such that the overlapping wiring routes 32A2-32J2 are cut in the direction along the longitudinal direction. The perforation lines 39 do not overlap the overlapping wiring routes 32A2-32J2 in a plan view and every two perforation lines 39 are arranged opposite each other to sandwich the overlapping wiring route 32A2-32J2. The perforation line 39 has a curved shape and at least one end portion 39A is curved toward the center 22A1 side. At least a portion of the perforation line 39 preferably overlaps in a plan view a portion with which the medicine T is contacted when the medicine T is pushed out. Accordingly, a portion of the perforation line 39 is surely pushed by the medicine T that is pushed out and this increases the effects of assisting the breaking.

Figure 20:
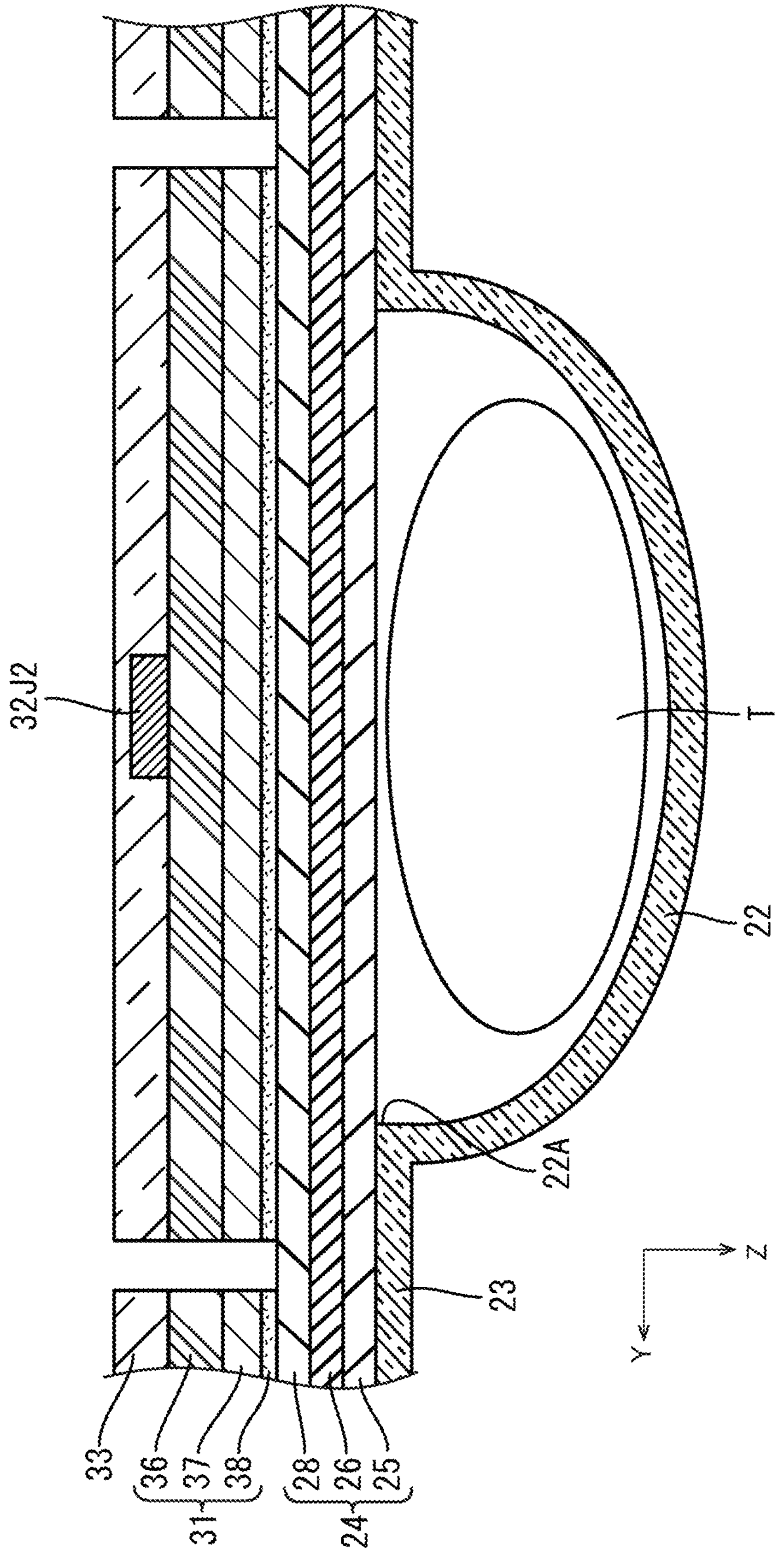
FIG. 20 a cross-sectional view taken along V-V line in FIG. 19

As illustrated in FIGS. 17 and 20, the perforation line 39 is a through hole (a slit) that is through the base layer 31, the protection layer 33, and the adhesive layer 38; however, the perforation line 39 may not necessarily extend through all the layers. The perforation line 39 may be a so-called half slit and may be formed in a groove such that a thickness of the base layer 31, the protection layer 33, and the adhesive layer 38 with respect to the layered direction (the Z-axis direction) is reduced compared to other portions. The perforation line 39 is not necessarily entirely formed as a through hole or a half slit but may be formed to partially include through holes or half slits in perforations (dots), for example.

Figure 22:
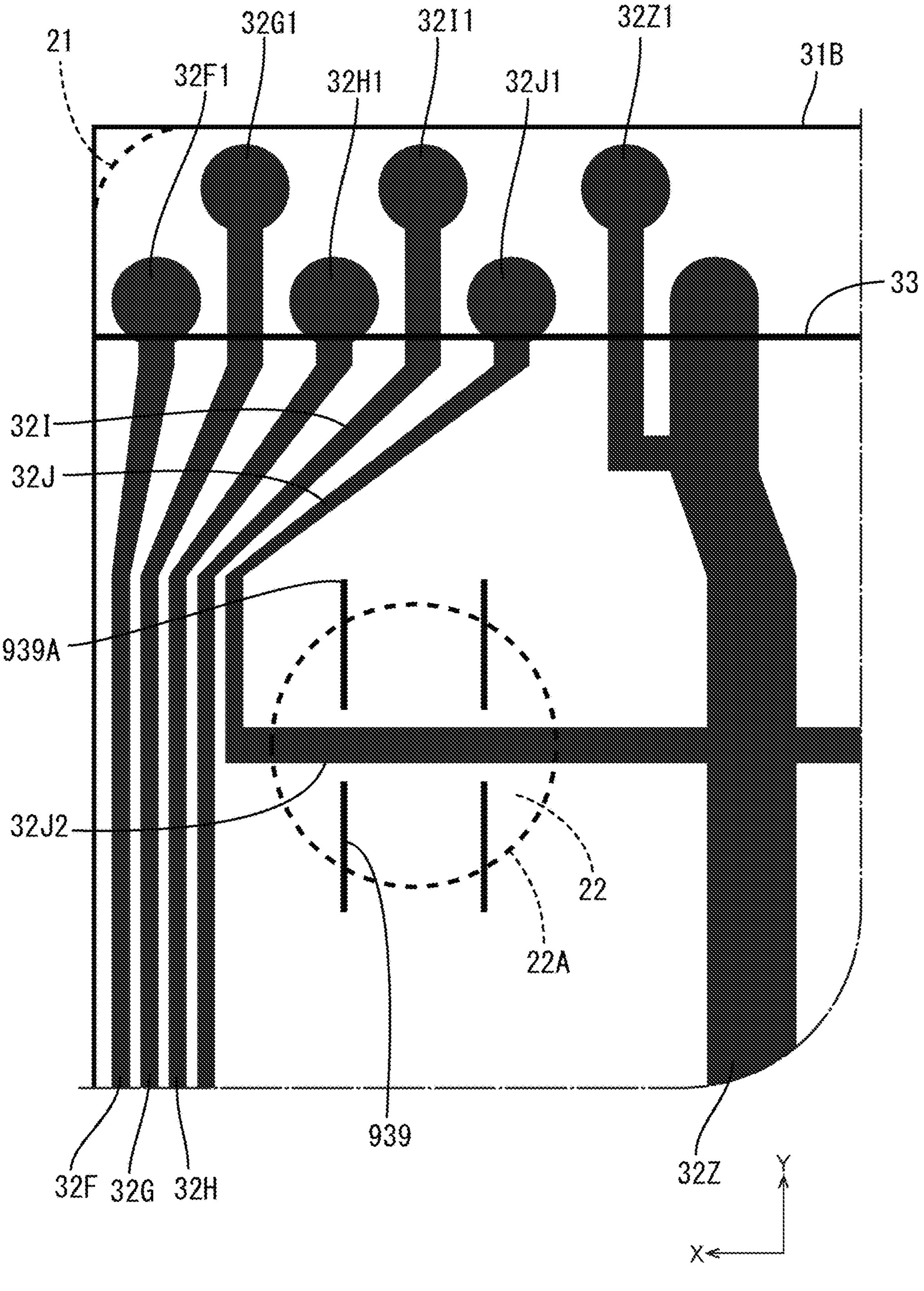

With the perforation lines 39 described above, the overlapping wiring route 32A2-32J2 is broken more surely when the medicine T is pushed out from the storing portion 22 as illustrated in FIG. 21. With the end portion 39A of each perforation line 39 being curved toward the center 22A1 side of the storing portion 22, the opening detection wiring route 32A-32J corresponding to another storing portion 22, which is not the storing portion 22 to be opened, is less likely to be broken erroneously when the cover 24 and the opening detection sheet 30 are broken. As illustrated in FIG. 22, perforation lines 939 of a comparative example include one end portions 939A that are not curved. In the comparative example, when the opening portion 22 overlapping the overlapping wiring route 32J2 is opened, not only the overlapping wiring route 32J2 that is to be broken but also a portion of the wiring route 32I may be broken. As a result, it may be erroneously detected that an unopened storing portion 22 is in an open state. With the perforation lines 39 of this embodiment, the direction in which the opening detection sheet 30 is torn is restricted (controlled), and therefore, the erroneous breaking of the wiring route 32A-32J is less likely to occur and eventually, the erroneous detection is less likely to occur.

Next, a specific processing of the opening management system 10 having the above-described configuration will be described with reference to FIGS. 23A, 23B, 24A, 24B. In the following, a transmission flow of information sequentially from the information processing terminal 70 to the opening detection device 40 via the management server 60 and the communication server 86 is defined as downlink communication. A transmission flow of information sequentially from the opening detection device 40 to the information processing terminal 70 via the communication server 86 and the management server 60 is defined as uplink communication.

A user launches an application stored in the information processing terminal 70 and inputs registration information of the opening detection device 40. When inputting the registration information, a user inputs the ID information on the casing 50 of the opening detection device 40 to the information processing terminal 70 or the information processing terminal 70 directly reads the ID information. Accordingly, the management server 60 records the corresponding relation of the ID information of the opening detection device 40 and the identification information of the information processing terminal 70. The ID information may be on the casing 50 of the opening detection device 40 in plaintext format or a ciphered code representing the ID information may be on the casing 50. The ciphered code may be decoded by the management server 60 to obtain the ID information. The ID information of the opening detection device 40 may be unique information of each opening detection device 40 or each information processing terminal 70. The identification information of the information processing terminal 70 may be unique information of the information processing terminal 70 or unique information of a user who uses the information processing terminal 70.

Figure 23A:
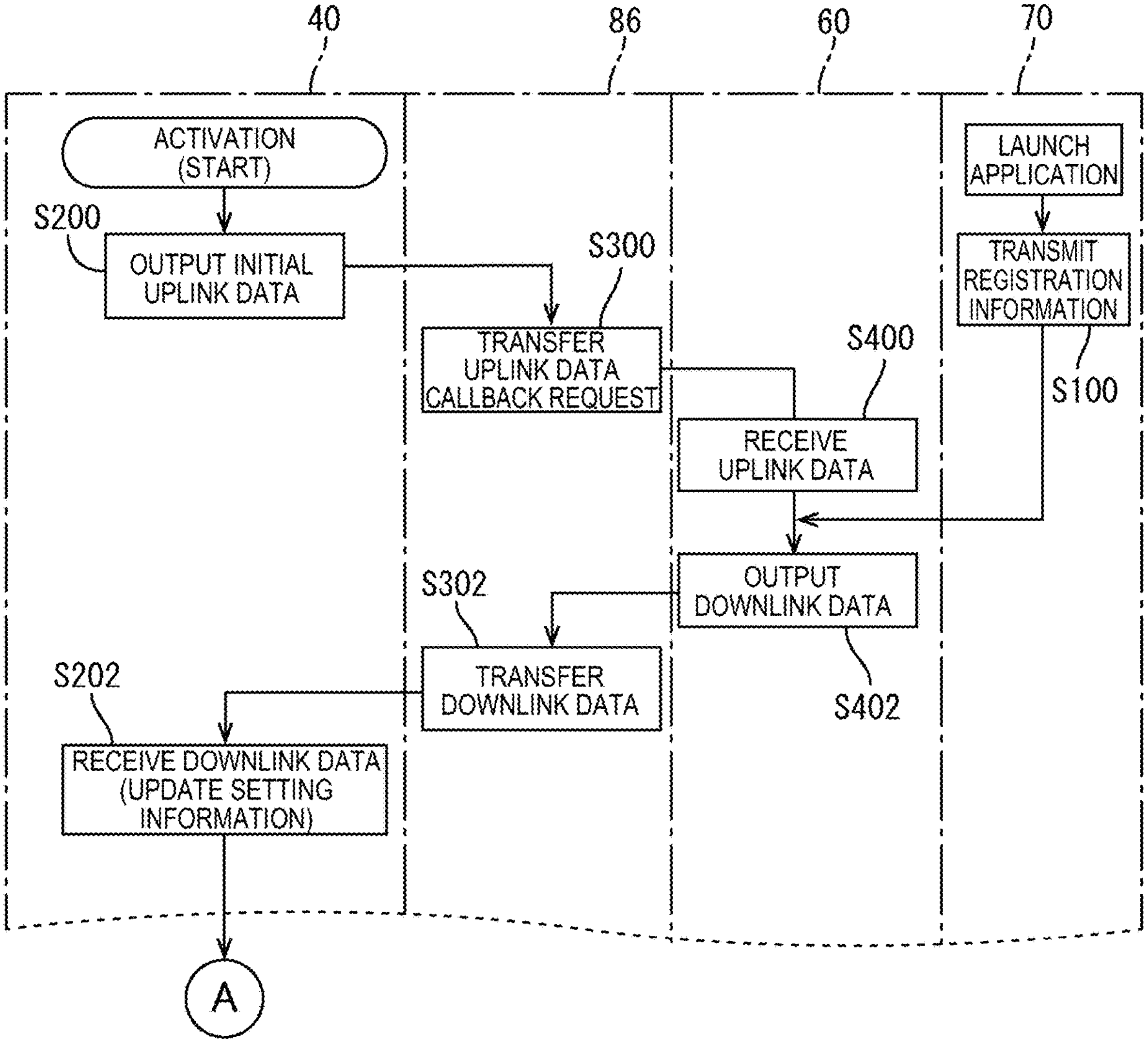

As illustrated in FIG. 23A, the input registration information is transmitted to the management server 60 from the information processing terminal 70 via a downlink (S100). Specifically, the registration information includes information representing medication time to take medicine T (one example of detection time), information representing opening detection frequency of detection with the opening detection device 40, information representing setting of a notification type with the opening detection device 40, information representing transmission frequency of transmitting the opening detection result from the opening detection device 40, and information representing request frequency of transmission of setting information from the management server 60. The registration information transmitted via a downlink to the management server 60 is linked to the ID information of the opening detection device 40 and the identification information of the information processing terminal 70.

The registration information relating the medication time includes each medication time if the medicine is to be taken several times a day. For example, if the medicine is to be taken three times a day after meal, the medication times include the time after breakfast, the time after lunch, and the time after supper. The opening detection frequency is for setting one of regular detection of regularly detecting at every predetermined timing (referred to as regular detection, hereinafter) or continuous detection (referred to as real time detection, hereinafter), and further for setting a time interval (for example, five minutes, ten minutes, fifteen minutes, twenty minutes, thirty minutes, sixty minutes, one hundred and twenty minutes) with the regular detection being performed. With performing the regular detection, power consumption can be reduced compared to performing the real time detection and as the time interval of the regular detection is set to be longer, the power consumption can be further reduced. In this embodiment, the operations of the regular detection will be described specifically.

The setting of a notification type represents setting of a lighting pattern of the LED 45 when the medicine is not taken (not opened) and can be selected from various types of patterns having different turned-on periods with steady light (blinking light). The transmission frequency of transmitting the opening detection result from the opening detection device 40 represents setting of whether or not to perform information transmission (uplink) from the opening detection device 40 only when the opening detection result changes. If the transmission is performed only when the opening detection result changes, the data transmission frequency with the opening detection device 40 can be reduced and the power consumption is also reduced. In this embodiment, the operations with performing data transmission only when the opening detection result changes will be specifically described.

The request frequency of transmission of setting information from the management server 60 (referred to as regular downlink frequency, hereinafter) is for setting the number of transmission to be once a day (for example, after the medication time after supper) or several times a day (for example, after each medication times after breakfast, after lunch, after supper). By adjusting the regular downlink frequency, the setting information of the opening detection device 40 can be updated and the power consumption necessary for the updating can be adjusted to be as small as possible. In this embodiment, the operations when the regular downlink frequency is set to be after each medication time will be specifically described.

As illustrated in FIG. 23A, with the opening detection device 40 being activated, initial data is transmitted from the opening detection device 40 via an uplink (S200). Data transmitted from the opening detection device 40 via an uplink (uplink data) includes ID information, opening time, opening detection result (a determination result regarding the opening status of each storing portion 22 made by the control section 44), residual energy of the rechargeable battery 47, connection or disconnection of the circuit pattern 32 of the packaging material 20 and the connection portion 41, and an operation state of an independent mode. The uplink data that is set when the opening detection device 40 is activated or the reset button 46 is turned on is defined as the initial data. The uplink data includes the ID information of the opening detection device 40. Therefore, even if there are several opening detection devices 40 (there are several packaging materials 20 (several kinds of medicines T)), the opening detection is performed for each opening detection device 40 and each opening detection device 40 can inform the opening status.

The independent mode is operated when downlink data, which will be described later, is not transmitted to the opening detection device 40 due to the poor connection. In the independent mode, the uplink data is not transmitted at the data transmission frequency (transmission frequency of transmitting the opening detection result) that is set based on the registration information input through an application software but transmitted at the regular interval determined by a timer included in the control section 44 of the opening detection device 40. In the independent mode, even if the downlink data is not normally transmitted to the opening detection device 40 due to the poor connection, the uplink data can be transmitted from the opening detection device 40. However, since the present time included in the downlink data is not transmitted to the opening detection device 40, the LED 45 is not turned on with blinking light to make alert notification and inform that the medicine is not taken when the independent mode is operated.

As illustrated in FIG. 23A, if the communication server 86 receives the uplink data from the opening detection device 40, the communication server 86 transfers the uplink data to the management server 60 and requests the management server 60 callback of (to transmit) the setting information (S300). The management server 60 receives the uplink data that is transferred from the communication server 86 (S400). The information generation section 62 of the management server 60 generates the setting information based on the registration information that is transmitted from the information processing terminal 70 at step S100. The setting information is used when the opening detection device 40 performs the predefined process regarding the opening detection. The setting information (referred to as the downlink data, hereinafter) is output (transmitted) in response to the callback request of the communication server 86 (S402). In this embodiment, the downlink data is the setting information that is generated as 64-bit data and includes the registration information previously described and the present time.

As illustrated in FIG. 23A, the communication server 86 receives the downlink data from the management server 60 and transfers the downlink data to the opening detection device 40 (S302). The downlink data is rewritten in the storing section 48 of the opening detection device 40 and the setting information of the opening detection device 40 is updated (S202). Therefore, after the updating, the control section 44 of the opening detection device 40 performs the predefined process regarding the opening detection based on the updated setting information.

Figure 23B:
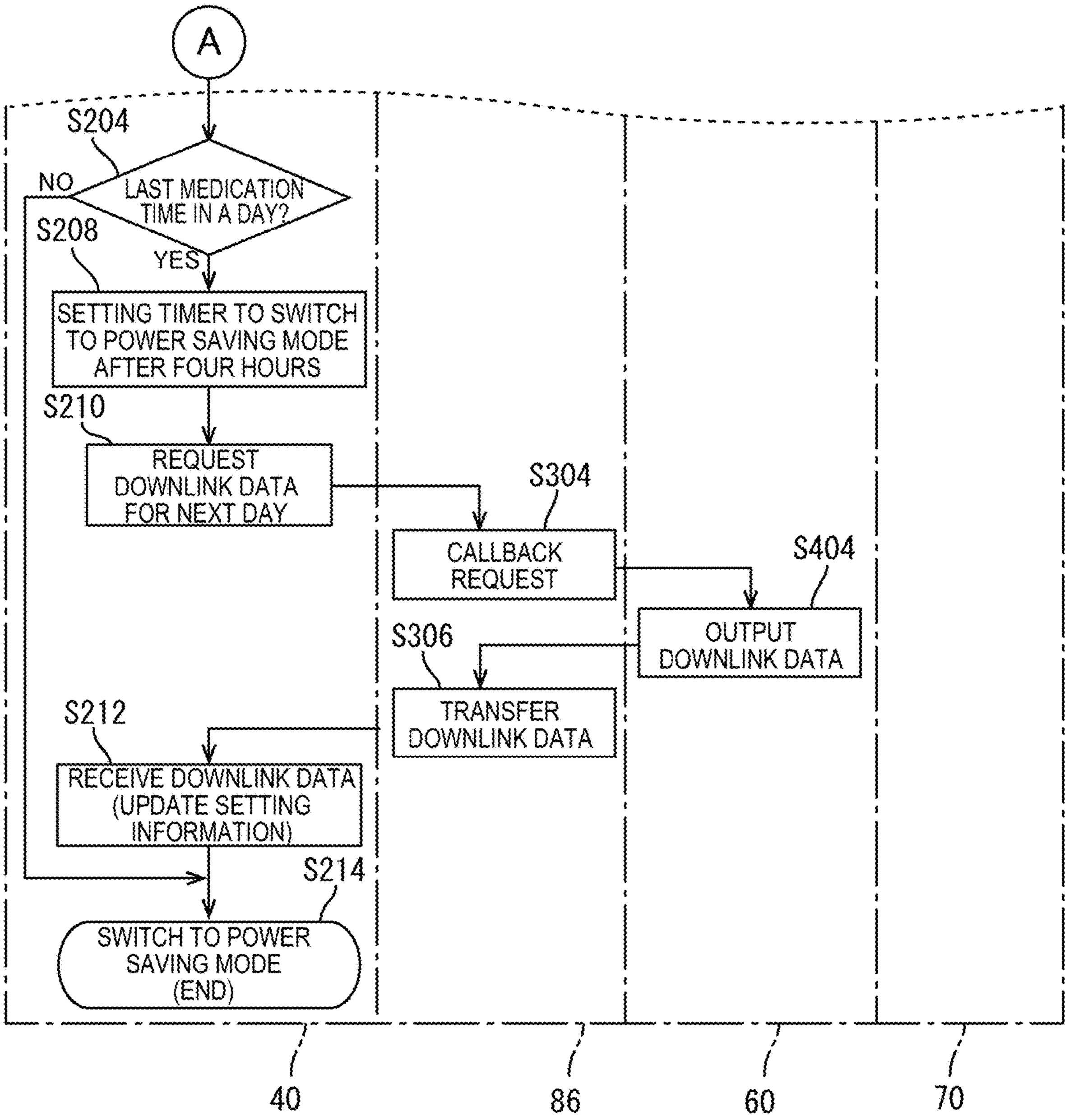

Next, as illustrated in FIG. 23B, the control section 44 of the opening detection device 40 determines whether it is the last medication time in a day (for example, it is the third time if the frequency is three times a day) (S204). If it is determined to be the last medication time (YES at S204), the control section 44 sets a timer to switch the operation mode to a power saving mode (night mode) after predetermined period has passed (for example, after four hours) (S208). The night mode is one of the power saving modes and in the night mode, the operation of a stand-by mode, which will be described later, is performed and the regular detection is not performed. In the power saving mode, the opening detection device 40 is set in a stand-by state while no medication is necessary and the opening detection is not necessary such as during night time, and the power consumption can be reduced by not performing the opening detection.

After setting the timer, if the downlink data for the next day is requested by the opening detection device 40 (S210), the callback request is output from the communication server 86 (S304) and the downlink data is output (transmitted) from the management server 60 (S404). The downlink data is transmitted to the opening detection device 40 via the communication server 86 (S306). The downlink data is rewritten in the storing section 48 of the opening detection device 40 and the setting information of the opening detection device 40 is updated (S212). After the time set by the timer at step S206 passes, the operation mode of the opening detection device 40 is switched to the power saving mode and becomes in the stand-by state (S214). On the other hand, it is not determined to be the last medication time at step S204 (NO at S204), the control section 44 switches the operation mode of the opening detection device 40 to the power saving mode (the stand-by mode) (S214). The stand-by mode is one of the power saving modes. In the stand-by mode, the opening detection (supplying a current to the connection portion 41 of the opening detection device 40, detecting a voltage generated in the circuit pattern 32 of the packaging material 20, and determining the opening status) is not performed.

Figure 24A:
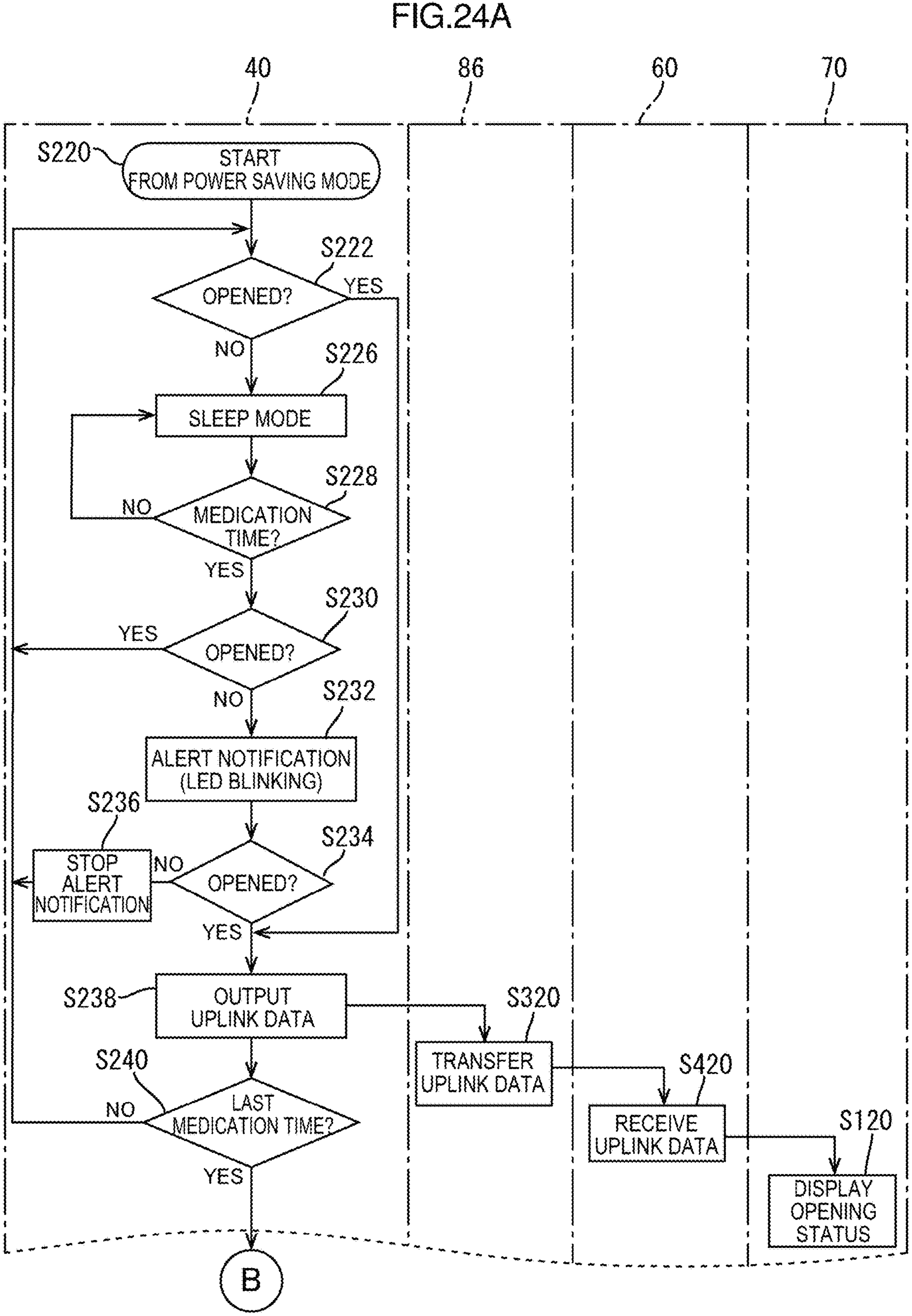

After the operation mode is switched to the power saving mode (S214 in FIG. 23B), as illustrated in FIG. 24A, the opening detection device 40 is started in the power saving mode at a predetermined timing (for example, in performing the regular detection, at an activation timing in response to the timer of the control section 44 based on the detection interval included in the downlink data) (S220). The control section 44 determines whether each storing portion 22 is opened (S222) and if determining that the storing portion 22 is opened, the control section 44 outputs (transmits) the uplink data (S238). The uplink data is transmitted to the management server 60 (S420) via the communication server 86 (S320) and the opening status is displayed on the information processing terminal 70 (S120). On the other hand, if it is determined that the storing portion 22 is not opened at step S222, the control section 44 switches the operation mode of the opening detection device 40 to the power saving mode (the stand-by mode) (S226).

Next, if determining that the present time is on or after the medication time (YES at S228), the control section 44 releases the power saving mode (the stand-by mode) (S229) and performs the opening detection process again (S230). If it is determined that the opening status is an unopened state (NO at S230), the packaging material 20 is not opened (the medicine T is not taken out) although it is past the medication time. The LED 45 is turned on with blinking light to make alert notification (S232). On the other hand, if it is determined that the opening status is an opened state (YES at S230), the process returns to step S222.

Next, the control section 44 performs the opening detection process again after the predefined time interval of the regular detection (S234). If it is determined that the opening status is an unopened state (NO at S234), the opening status does not change from the unopened state, which is the previous opening detection result (NO at S230), the uplink data is not output (transmitted) and the alert notification is stopped after a predefined time passes (S236) and the process returns to step S222. On the other hand, if it is determined that the opening status is the opened state (YES at S234), the opening status changes from the unopened state, which is the previous opening detection result (NO at S230), the uplink data is output (transmitted) to the communication server 86 (S238). The uplink data includes data representing the opened time that corresponds to the present time when the control section 44 of the opening detection device 40 detects the opened state. The uplink data is transmitted to the management server 60 (S420) via the communication server 86 (S320) as previously described and the opening status is displayed on the information processing terminal 70 (S120). The management server 60 transmits the uplink data to the information processing terminal 70 and the information processing terminal 70 displays the opening status, which at least includes the opened time, based on the uplink data. The management server 60 obtains the ID information of the opening detection device 40, which is included in the uplink data, and transfers the uplink data to the information processing terminal 70 from which the registration information corresponding to the obtained ID information is inputted.

After outputting the uplink data (S238), the control section 44 of the opening detection device 40 determines whether the present time is on or after the last medication time (S240). The last medication time is the latest time among the multiple medication times included in the downlink data. The last medication time is the last time that the medicine T must be taken and is the time after the predetermined time past the medication time. The medicine T is required to be taken on or after the medication time and at least before the last medication time. Therefore, the packaging material 20 is required to be opened on or after the medication time and before the last medication time. If the present time is not on or after the last medication time (NO at S240), the process returns to step S222 and the process regarding the opening detection that is previously described will be repeatedly performed.

Figure 24B:
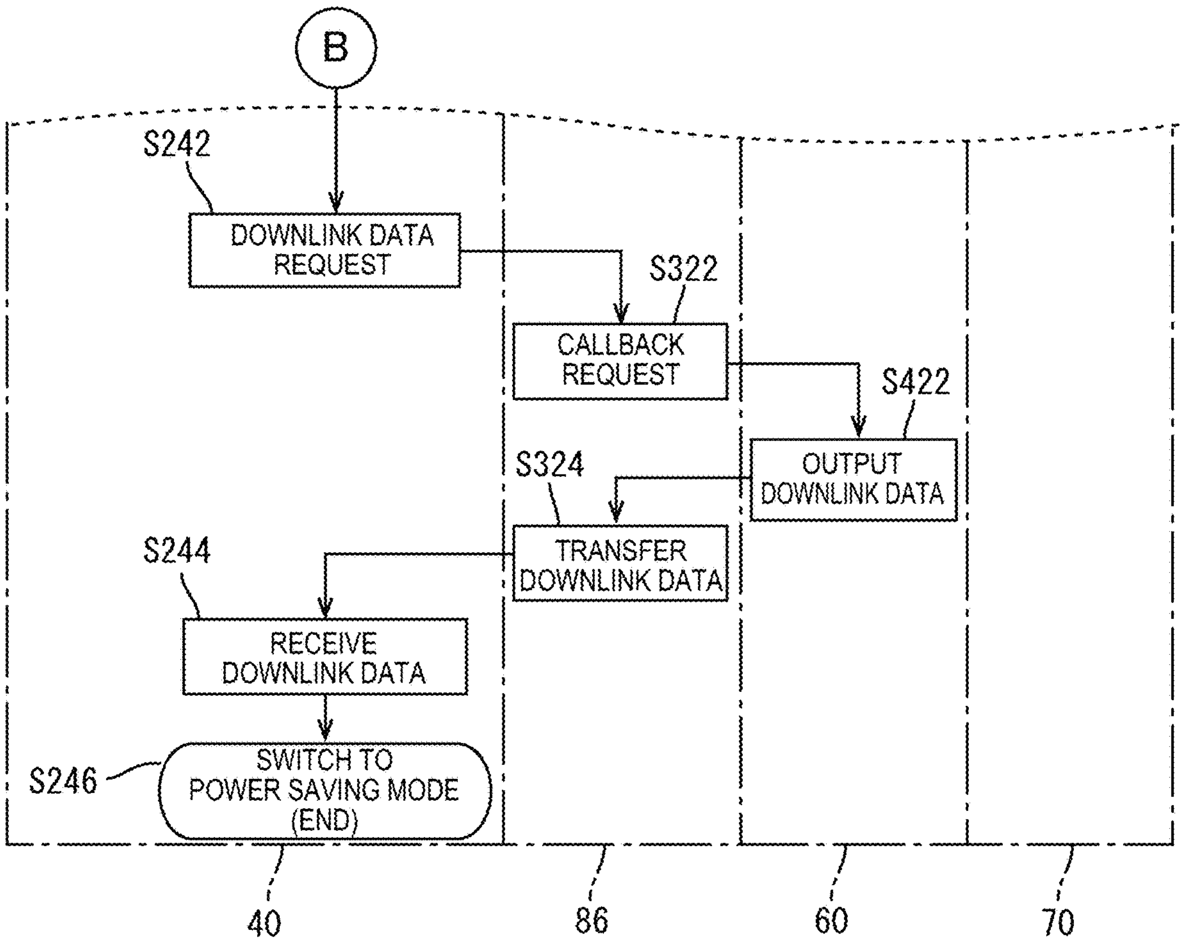

If the present time is on or after the last medication time (YES at S240), as illustrated in FIG. 24B, the opening detection device 40 requests the downlink data (S242) and the callback request is output from the communication server 86 (S322) and the downlink data is output (transmitted) from the management server 60 (S422). The downlink data is transmitted to the opening detection device 40 via the communication server 86 (S324). The downlink data is rewritten in the storing section 48 of the opening detection device 40 and the setting information of the opening detection device 40 is updated (S244). After the updating, the operation mode of the opening detection device 40 is switched to the power saving mode (S246).

Second Embodiment

Figure 25:
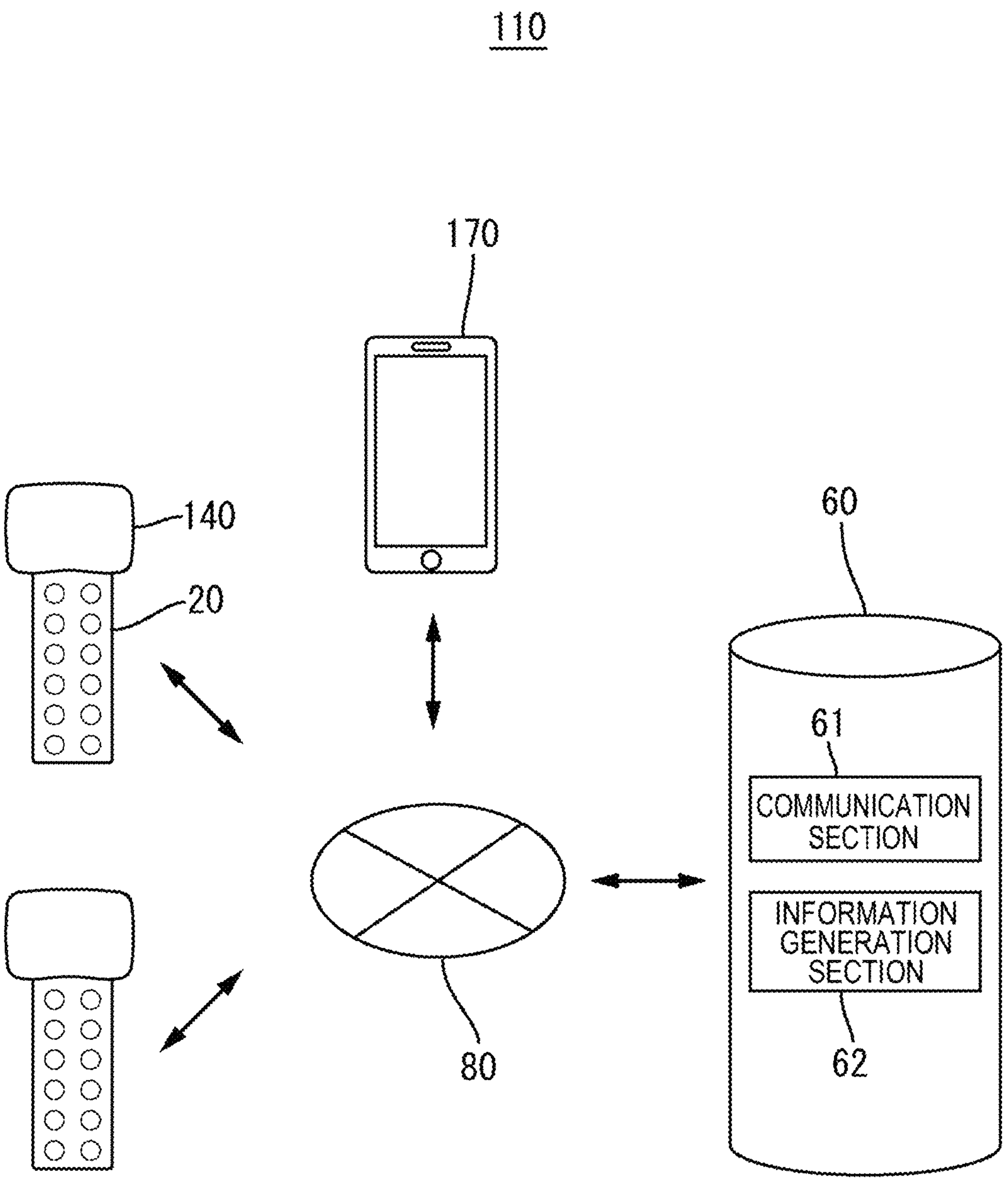

An opening management system 110 according to a second embodiment will be described with reference to FIG. 25. The configuration, operations, and effects of the second embodiment that are similar to those of the first embodiment will not be described.

In the opening management system 110, opening detection devices 140 are connected to an information processing terminal 170 with Bluetooth low energy (BLE, registered trademark) so as to communicate each other. The opening detection device 140 includes a BLE communication module and the information processing terminal 170 has a BLE function. With such a configuration, the opening detection device 140 is paired to the information processing terminal 170 and the opening detection device 140 can communicate with the management server 60 that is connected to the communication network 80 via the information processing terminal 170. Accordingly, even with the LPWA communication being not available (for example, in the area without having the base station 85), the opening detection and the notification based on the opening status can be performed.

Third Embodiment

Figure 26:
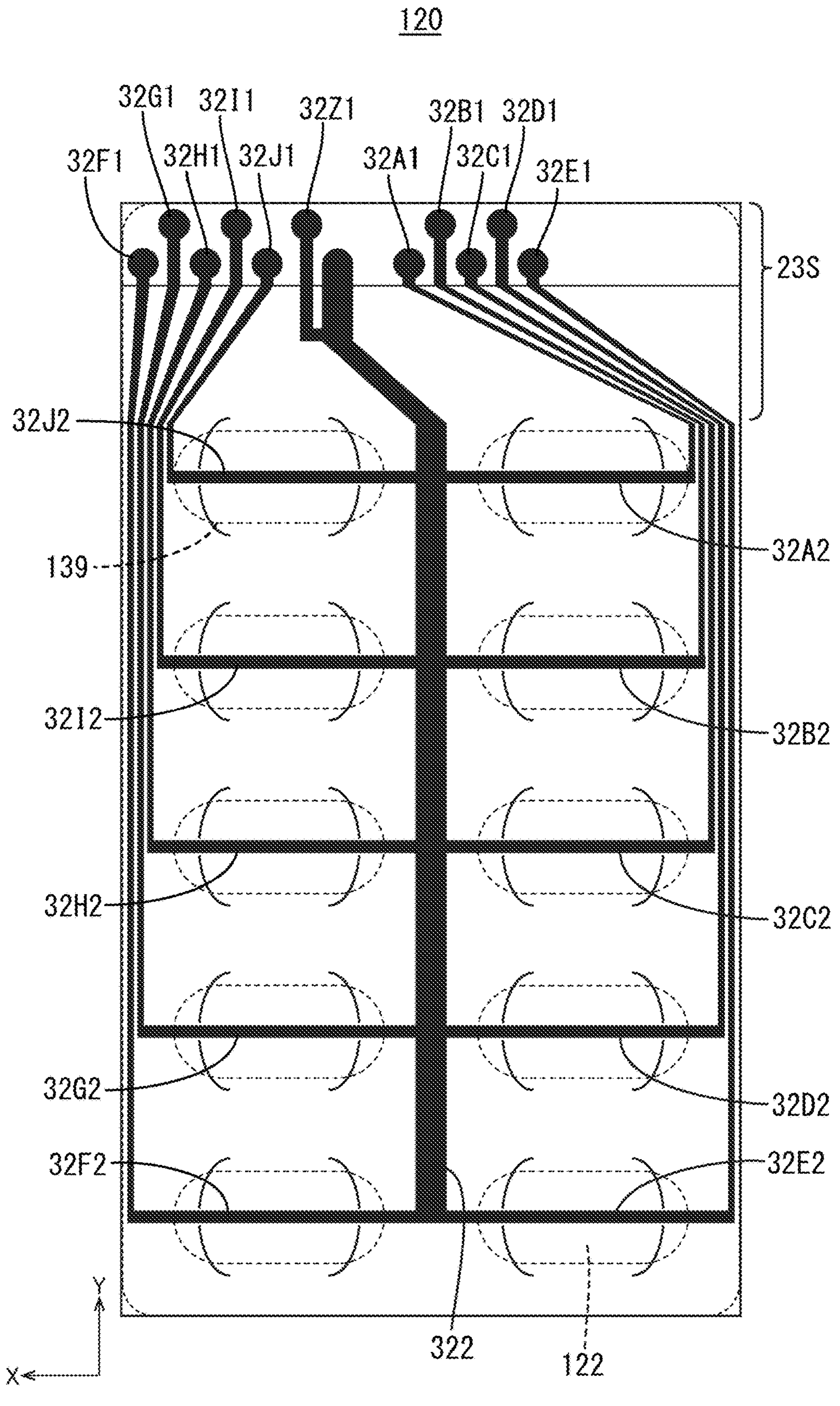

A packaging material 120 according to a third embodiment will be described with reference to FIG. 26. The configuration, operations, and effects of the second embodiment that are similar to those of the first embodiment and the second embodiment will not be described.

With respect to the packaging material 120, the medicine T is an elongated capsuled tablet and accordingly, each storing portion 122 has an elongated oval plan view shape. The dimension of the storing portion 122 measured in the X-axis direction is greater than that of the first embodiment. The planar shape and the planar size of the packaging material 120 differ from those of the first embodiment. The first terminal 32Z1 and the second terminals 32A1-32J1 of an opening detection sheet 130 are arranged at the same intervals as those of the first embodiment and the positions of the first terminal 32Z1 and the second terminals 32A1-32J1 correspond to the positions of the contacts 41B of the opening detection device 40. With such a configuration, the opening detection device 40 having the same configuration can be used for the packaging material 120, which has a different planar size, to perform the opening detection. Perforation lines 139 are formed at positions according to the shape of the medicine T. The perforation lines 139 are formed to overlap in a plan view the position where the medicine T is contacted when the medicine T is pushed out.

Other Embodiments

The present invention is not limited to the embodiments described above with reference to the drawings. For example, the following embodiments may be included in the technical scope of the present invention.

(1) The shape of the body member 21, and the shape, the number, and the intervals of the storing portions 22, 122 illustrated in the drawings are examples and may be altered as appropriate. The shape and the size of the opening detection sheet 30, 130, the number of wiring routes of the circuit pattern 32, and the number of perforation lines 39, 139 may be also altered as appropriate accordingly.

(2) The shape of the casing 50 illustrated in the drawings is one example and may be altered as necessary.

Examples of Using Uplink Data

As previously described, the management server 60 transfers the uplink data to the information processing terminal 70; however, the management server 60 may transmit various kinds of processed data that is generated with performing information processing based on the uplink data to the information processing terminal 70. Furthermore, the management server 60 may transmit the uplink data or the processed data to a terminal t other than the information processing terminal 70 to which the registration information is input.

The uplink data and the processed data may be transmitted to a terminal that is used by a person who takes medicine T packed in the packaging material 20, a terminal in the hospital that provides the medicine T, a terminal used by a pharmaceutical manufacturer that produces the medicine T, or a terminal that is used by a distributer of the medicine T. The management server 60 is preferably configured such that the uplink data and the processed data cannot be accessed by external devices and the uplink data and the processed data are transmitted only to reliable receivers. The management server 60 may cipher the uplink data and the processed data and store them such that only the reliable receivers can decode.

As previously described, the management server 60 may perform the following information processing based on the uplink data. The management server 60 may create an opening time data base that includes a plurality of registration information input via the information processing terminal 70 and a plurality of opening times that are represented by the uplink data. Furthermore, the management server 60 may compare the medication time represented by the registration information and the opening time and determine whether the medicine is appropriately taken and transmit the processed data representing the determination result to the terminal. Such processed data is helpful to a person who prescribes the medicine T such as a doctor and a pharmacist and also helpful to a person who takes the medicine T.

The management server 60 may generate the processed data by statically processing the opening times stored in the opening time data base. Specifically, the management server 60 may statistically process the opening times for every attribute (for example, age and sex) of the persons who take medicine T or may statistically process the opening times for every kind of the medicines T. Furthermore, the management server 60 may create a prediction model for predicting the medication status of the medicine T through the machine learning with using the opening times stored in the opening time data base as training data. The management server 60 may transmit the data representing the medication status that is predicted according to the prediction model to each terminal as the processed data.

The packaging material 20 is not necessarily for packaging the medicine T but may be for packaging any objects as long as the packaging material is to be opened and the objects are used or consumed. Furthermore, the packaging material may be any packaging material as long as the opening detection device 40 can be attached to and the objects are not necessarily sealed in the packaging material. The packaging material may be a sealing material that is to be attached to a container storing an object and the stored object. Such packaging material may be broken by taking the stored object out of the container. For example, the packaging material may be a sealing material attached to a file folder as a container and a book or a booklet as a stored object. For example, with the present invention being applied to an object having a limited expiration date such as a food, it can be confirmed whether the object is consumed at a proper timing based on the opening time represented by the uplink data. With the present invention being applied to an object having an unlimited expiration date, the consumption condition of the object can be obtained based on the opening time represented by the uplink data. Therefore, helpful information can be provided to the suppliers or the producers of the objects.

EXPLANATION OF SYMBOLS

20, 120: packaging material, 22, 122: storing portion, 24: cover, 30, 130: opening detection sheet, 31: base layer, 32: circuit pattern, 32A, 32B, 32C, 32D, 32E, 32F, 32G, 32H, 32I, 32J: wiring route, 32A1, 32B1, 32C1, 32D1, 32E1, 32F1, 32G1, 32H1, 32I1, 32J1: second terminal, 32Z: common wiring route, 32Z1: first terminal, 40, 140: opening detection device (external device), T: medicine (stored object), 32A2, 32B2, 32C2, 32D2, 32E2, 32F2, 32G2, 32H2, 3212, 32J2: overlapping wiring route, 33: protection layer, 38: adhesive layer, 39, 139: perforation line, 50: release paper

The invention claimed is:

1. An opening detection sheet to be attached to a packaging material including storing portions, the opening detection sheet comprising:

a base layer;

a circuit pattern disposed on the base layer and including wiring routes, each of the wiring routes being provided for each of the storing portions, a first terminal being at one end of each of the wiring routes and to be connected to an external device that detects opening of the storing portions based on an electrical resistance of the circuit pattern, the wiring routes include a common wiring route that extends in a predetermined direction from the first terminal and is a common route for all of the wiring routes, the first terminal is disposed at a same position with respect to all of the wiring routes, a predetermined reference potential is supplied from the external device via the first terminal to the common wiring route, and a width of the common wiring route to which the reference potential is supplied is greater than a width of other portions of the wiring routes.

2. The opening detection sheet according to claim 1, further comprising second terminals each of which is at other end of each of the wiring routes and to be connected to an external device, the second terminals being disposed for the wiring routes, respectively.

3. The opening detection sheet according to claim 2, wherein the second terminals are disposed at different positions for the wiring routes, respectively.

4. The opening detection sheet according to claim 2, wherein the base layer has a rectangular plan view shape, and the first terminal and the second terminals are disposed on one edge portion of the plan view shape.

5. The opening detection sheet according to claim 2, wherein the base layer has an elongated rectangular shape, and the first terminal and the second terminals are disposed on one short-side edge portion of the rectangular shape.

6. The opening detection sheet according to claim 5, wherein as a distance from the one short-side edge portion to the storing portions increases, the wiring routes corresponding to the storing portions become longer.

7. The opening detection sheet according to claim 5, wherein the wiring routes have a U-shape extending from the first terminal to the second terminals, respectively.

8. A packaging material comprising:

a cover with which the storing portions are sealed; and the opening detection sheet according to claim 1, the opening detection sheet being attached to the cover, wherein an object stored in one of the storing portions can be taken out by pushing and breaking the cover and the opening detection sheet.

9. The packaging material according to claim 8, wherein the wiring routes overlap centers of the storing portions, respectively, in a plan view.

10. The opening detection sheet according to claim 1, further comprising perforation lines for assisting breaking of the wiring routes, wherein the wiring routes include overlapping wiring routes each of which overlaps at least one of the storing portions in a plan view, each of the perforation lines is provided for each of the storing portions, and each of the perforation lines has an end portion that is curved toward a center side of a corresponding one of the storing portions.

11. The opening detection sheet according to claim 10, wherein the perforation lines are disposed to sandwich each of the overlapping wiring routes.

12. The opening detection sheet according to claim 10, wherein the perforation lines are disposed to surround a center of each of the storing portions.

13. The opening detection sheet according to claim 10, wherein at least a portion of each of the perforation lines extends through the base layer.

14. The opening detection sheet according to claim 10, further comprising:

an adhesive layer disposed on the base layer on an opposite side from the circuit pattern; and a release paper that is to be removed from the adhesive layer before the opening detection sheet being bonded to the packaging material to expose the adhesive layer.

15. A packaging material comprising:

a cover with which the storing portions are sealed; and the opening detection sheet according to claim 10 attached to the cover, wherein objects stored in the storing portions can be taken out by pushing and breaking the cover and the opening detection sheet.

16. The packaging material according to claim 15, wherein each of the storing portions stores an object, and at least a portion of the perforation lines overlaps in a plan view a position where the object is to be contacted when the object is pushed out.

17. A packaging material comprising:

an opening detection sheet attached to the packaging material, the packaging material having a plurality of storing portions, the opening detection sheet comprising:

a base layer; and a circuit pattern disposed on the base layer and including wiring routes, each of the wiring routes being provided for each of the storing portions, a first terminal being at one end of each of the wiring routes and configured to be connected to an external device, the first terminal being at a same position on different ones of the wiring routes, the opening detection sheet further comprising perforation lines for assisting breaking of the wiring routes, the wiring routes including overlapping wiring routes each of which overlaps at least one of the storing portions in a plan view, each of the perforation lines being provided for each of the storing portions, each of the perforation lines having an end portion curved toward a center side of a corresponding one of the storing portions, a cover to which the opening detection sheet is attached and by which the storing portions are sealed, each of the storing portions storing an object, the object being removable by pushing and breaking the cover and the opening detection sheet, and at least a portion of the perforation lines overlapping, in a plan view, a position where the object is contacted when the object is pushed out, each of the perforation lines extending so as to intersect an opening edge of an opening of each of the storing portions in a plan view.

* * * * *